(12) United States Patent
Ahn et al.

(10) Patent No.: US 10,403,681 B2
(45) Date of Patent: Sep. 3, 2019

(54) MEMORY DEVICE INCLUDING A VARIABLE RESISTANCE MATERIAL LAYER

(71) Applicant: SAMSUNG ELECTRONICS CO., LTD., Suwon-si, Gyeonggi-do (KR)

(72) Inventors: Dong-ho Ahn, Hwaseong-si (KR); Zhe Wu, Suwon-si (KR); Soon-oh Park, Suwon-si (KR); Hideki Horii, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/832,958

(22) Filed: Dec. 6, 2017

(65) Prior Publication Data
US 2018/0277601 A1  Sep. 27, 2018

(30) Foreign Application Priority Data
Mar. 27, 2017  (KR) .......................... 10-2017-0038666

(51) Int. Cl.
*H01L 27/24* (2006.01)
*H01L 45/00* (2006.01)

(52) U.S. Cl.
CPC ...... *H01L 27/2427* (2013.01); *H01L 27/2436* (2013.01); *H01L 27/2463* (2013.01); *H01L 27/2481* (2013.01); *H01L 45/04* (2013.01); *H01L 45/06* (2013.01); *H01L 45/065* (2013.01); *H01L 45/126* (2013.01); *H01L 45/1233* (2013.01); *H01L 45/1246* (2013.01); *H01L 45/144* (2013.01); *H01L 45/146* (2013.01); *H01L 45/1683* (2013.01)

(58) Field of Classification Search
CPC combination set(s) only.
See application file for complete search history.

(56) References Cited

U.S. PATENT DOCUMENTS

| | | | |
|---|---|---|---|
| 6,990,017 B1 | 1/2006 | Parkinson et al. | |
| 7,289,349 B2 | 10/2007 | Campbell et al. | |
| 7,709,822 B2 | 5/2010 | Karpov et al. | |
| 7,880,123 B2 | 2/2011 | Kim et al. | |
| 8,871,559 B2 | 10/2014 | Horii et al. | |
| 9,054,295 B2 | 6/2015 | Gotti et al. | |
| 9,312,005 B2 | 4/2016 | Castro | |
| 9,337,422 B2 | 5/2016 | Cheong et al. | |
| 9,716,129 B1 * | 7/2017 | Sim .................... | H01L 27/2481 |
| 10,062,843 B2 * | 8/2018 | Jung ................... | H01L 45/1233 |
| 2006/0056251 A1 | 3/2006 | Parkinson | |

(Continued)

FOREIGN PATENT DOCUMENTS

KR  10-2011-0135285  12/2011

*Primary Examiner* — Telly D Green
(74) *Attorney, Agent, or Firm* — F. Chau & Associates, LLC

(57) ABSTRACT

A memory device is provided. The memory device includes a variable resistance layer. A selection device layer is electrically connected to the variable resistance layer. The selection device layer includes a chalcogenide switching material having a composition according to chemical formula 1 below, $$[Ge_A Se_B Te_C]_{(1-U)}[X]_U \qquad (1)$$

where $0.20 \leq A \leq 0.40$, $0.40 \leq B \leq 0.70$, $0.05 \leq C \leq 0.25$, $A+B+C=1$, $0.0 \leq U \leq 0.20$, and X is at least one selected from boron (B), carbon (C), nitrogen (N), oxygen (O), phosphorus (P), or sulfur (S).

20 Claims, 21 Drawing Sheets

(56) References Cited

U.S. PATENT DOCUMENTS

| | | |
|---|---|---|
| 2013/0265822 A1 | 10/2013 | Liu |
| 2016/0172420 A1 | 6/2016 | Bajaj et al. |
| 2016/0181320 A1* | 6/2016 | Kim .................... H01L 27/2409 365/148 |
| 2017/0170237 A1* | 6/2017 | Jung ................... H01L 45/1233 |
| 2017/0213870 A1* | 7/2017 | Sim ..................... H01L 27/2481 |
| 2017/0271581 A1* | 9/2017 | Seong ................. H01L 27/2481 |
| 2017/0309683 A1* | 10/2017 | Sim ..................... H01L 27/2481 |
| 2018/0358557 A1* | 12/2018 | Jung ................... H01L 45/1233 |

* cited by examiner

MEMORY DEVICE INCLUDING A VARIABLE RESISTANCE MATERIAL LAYER

CROSS-REFERENCE TO RELATED APPLICATION

This application claims priority under 35 U.S.C. § 119 to Korean Patent Application No. 10-2017-0038666, filed on Mar. 27, 2017, in the Korean Intellectual Property Office, the disclosure of which is incorporated by reference herein in its entirety.

TECHNICAL FIELD

Exemplary embodiments of the present inventive concept relate to a memory device, and more particularly to a memory device including a variable resistance material layer.

DISCUSSION OF RELATED ART

As electronic appliances become lighter, thinner, shorter, and smaller, demand for more highly integrated semiconductor devices has been increasing. A three-dimensional (3D) memory device may include a variable resistance material layer and a selection device layer. The 3D memory device may have a cross-point structure. A selection device layer for the 3D memory device may include a memory device including a chalcogenide material showing an Ovonic threshold switching (OTS) characteristic.

SUMMARY

According to an exemplary embodiment of the present inventive concept, a memory device may have a low off-current and may be relatively reliable.

According to an exemplary embodiment of the present inventive concept, a memory device includes a variable resistance layer, and a selection device layer electrically connected to the variable resistance layer. The selection device layer includes a chalcogenide switching material having a composition according to chemical formula 1 below,

where $0.20 \leq A \leq 0.40$, $0.40 \leq B \leq 0.70$, $0.05 \leq C \leq 0.25$, $A+B+C=1$, $0.0 \leq U \leq 0.20$, and X is at least one selected from boron (B), carbon (C), nitrogen (N), oxygen (O), phosphorus (P), or sulfur (S).

According to an exemplary embodiment of the present inventive concept, a memory device includes a plurality of first electrode lines positioned above a substrate and extending in a first direction that is in parallel with an upper surface of the substrate. A plurality of second electrode lines are positioned above the plurality of first electrode lines and extend in a second direction that is in parallel with the upper surface of the substrate and crosses the first direction. A plurality of third electrode lines are positioned above the plurality of second electrode lines and extend in the first direction. A plurality of memory cells are respectively formed at points where the plurality of first electrode lines and the plurality of second electrode lines cross one another and at points where the plurality of second electrode lines and the plurality of third electrode lines cross one another. Each of the plurality of memory cells includes a selection device layer and a variable resistance layer. The selection device layer includes a chalcogenide switching material having a composition according to the chemical formula 1.

Each of the plurality of memory cells includes a selection device layer and a variable resistance layer. The selection device layer includes a chalcogenide switching material having a composition according to chemical formula 1 below,

where $0.20 \leq A \leq 0.40$, $0.40 \leq B \leq 0.70$, $0.05 \leq C \leq 0.25$, $A+B+C=1$, $0.0 \leq U \leq 0.20$, and X is at least one selected from boron (B), carbon (C), nitrogen (N), oxygen (O), phosphorus (P), or sulfur (S).

According to an exemplary embodiment of the present inventive concept, a memory device includes a variable resistance layer including a chalcogenide memory material. A selection device layer is electrically connected to the variable resistance layer and includes a chalcogenide switching material having a composition according to the chemical formula 1 or chemical formula 2 below,

where $0.20 \leq A \leq 0.35$, $0.45 \leq B \leq 0.65$, $0.04 \leq C \leq 0.18$, $0.0 \leq D \leq 0.18$, $A+B+C+D=1$, $0.0 \leq U \leq 0.20$, and X is at least one selected from boron (B), carbon (C), nitrogen (N), oxygen (O), phosphorus (P), or sulfur (S).

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

Figure 1:
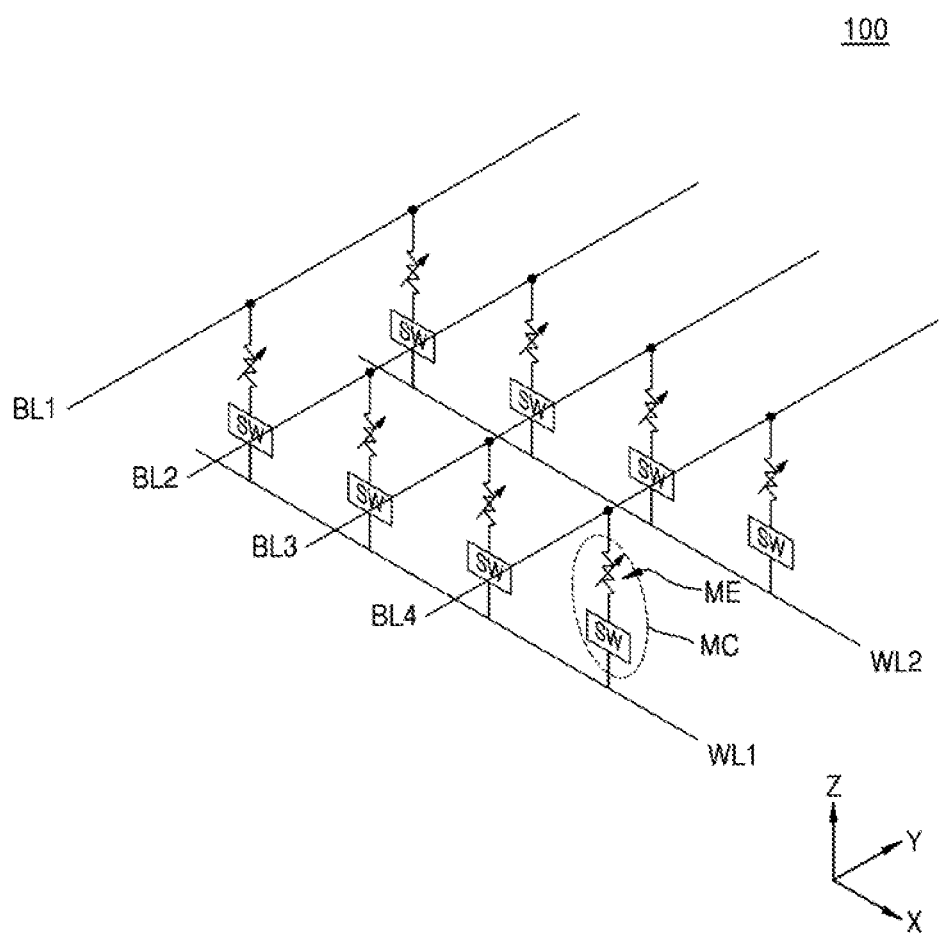
FIG. 1 is an equivalent circuit diagram of a memory device according to an exemplary embodiment of the present inventive concept.

FIG. 1 is an equivalent circuit diagram of a memory device according to an exemplary embodiment of the present inventive concept.

Referring to FIG. 1, a memory device 100 may include word lines WL1 and WL2 extending along a first direction (e.g., an X direction) and spaced apart from each other in a second direction (e.g., a Y direction) that is perpendicular to the first direction. The memory device 100 may include bit lines BL1, BL2, BL3, and BL4 that are spaced apart from the word lines WL1 and WL2 in a third direction (e.g., a Z direction) orthogonal to the first and second directions. The bit lines BL1, BL2, BL3, and BL4 may extend along the second direction.

Memory cells MC may be respectively arranged between the bit lines BL1, BL2, BL3, and BL4 and the word lines WL1 and WL2. As an example, the memory cells MC may be arranged at cross points between the bit lines BL1, BL2, BL3, and BL4 and the word lines WL1 and WL2, and may each include a variable resistance layer ME for storing information and a selection device layer SW for selecting a memory cell. The selection device layer SW may be referred to as a switching device layer or an access device layer.

The memory cells MC may be arranged along the third direction and may be structurally the same as one another. For example, in the memory cell MC arranged between the word line WL1 and the bit line BL1, the selection device layer SW may be electrically connected to the word line WL1, the variable resistance layer ME may be electrically connected to the bit line BL1, and the variable resistance layer ME and the selection device layer SW may be connected to each other in series.

However, exemplary embodiments of the present inventive concept are not limited thereto. For example, positions of the selection device layer SW and the variable resistance layer ME may be exchanged in the memory cell MC. For example, in the memory cell MC, the variable resistance layer ME may be connected to the word line WL1 and the selection device layer SW may be connected to the bit line BL1.

A method of driving the memory device 100 will be described in more detail below. A voltage may be applied to the variable resistance layer ME in the memory cell MC via the word line WL1 or WL2 and the bit line BL1, BL2, BL3, or BL4, so that electric current may flow through the variable resistance layer ME. For example, the variable resistance layer ME may include a phase change material layer that may be reversibly transited between a first phase and a second phase. However, the variable resistance layer ME is not limited thereto. For example, the variable resistance layer ME may include any type of variable resistor having a resistance value varying depending on an applied voltage. For example, in a selected memory cell MC, the resistance of the variable resistance layer ME may be reversibly transited between the first phase and the second phase according to a voltage applied to the variable resistance layer ME.

According to the resistance variation of the variable resistance layer ME, the memory cell MC may store digital information represented as '0' or '1' or may erase digital information from the memory cell MC. For example, data may be written as a high resistance state '0' and a low resistance state '1' in the memory cell MC. Writing of data from the high resistance state '0' to the low resistance state '1' may be referred to as a 'set operation', and writing of data from the low resistance state '1' to the high resistance state '0' may be referred to as a 'reset operation'. However, the memory cell MC according to exemplary embodiments of the present inventive concept is not limited to the digital information of the high resistance state '0' and the low resistance state '1' as described above, but may store various resistance states.

A memory cell MC may be addressed by selecting the word lines WL1 and WL2 and the bit lines BL1, BL2, BL3, and BL4, and the memory cell MC may be programmed by applying a predetermined signal between the word lines WL1 and WL2 and the bit lines BL1, BL2, BL3, and BL4. A current value may be measured via the bit lines BL1, BL2, BL3, and BL4 to read information according to the resistance value of the variable resistance layer in the corresponding memory cell MC, such as, programmed information.

Figure 2:
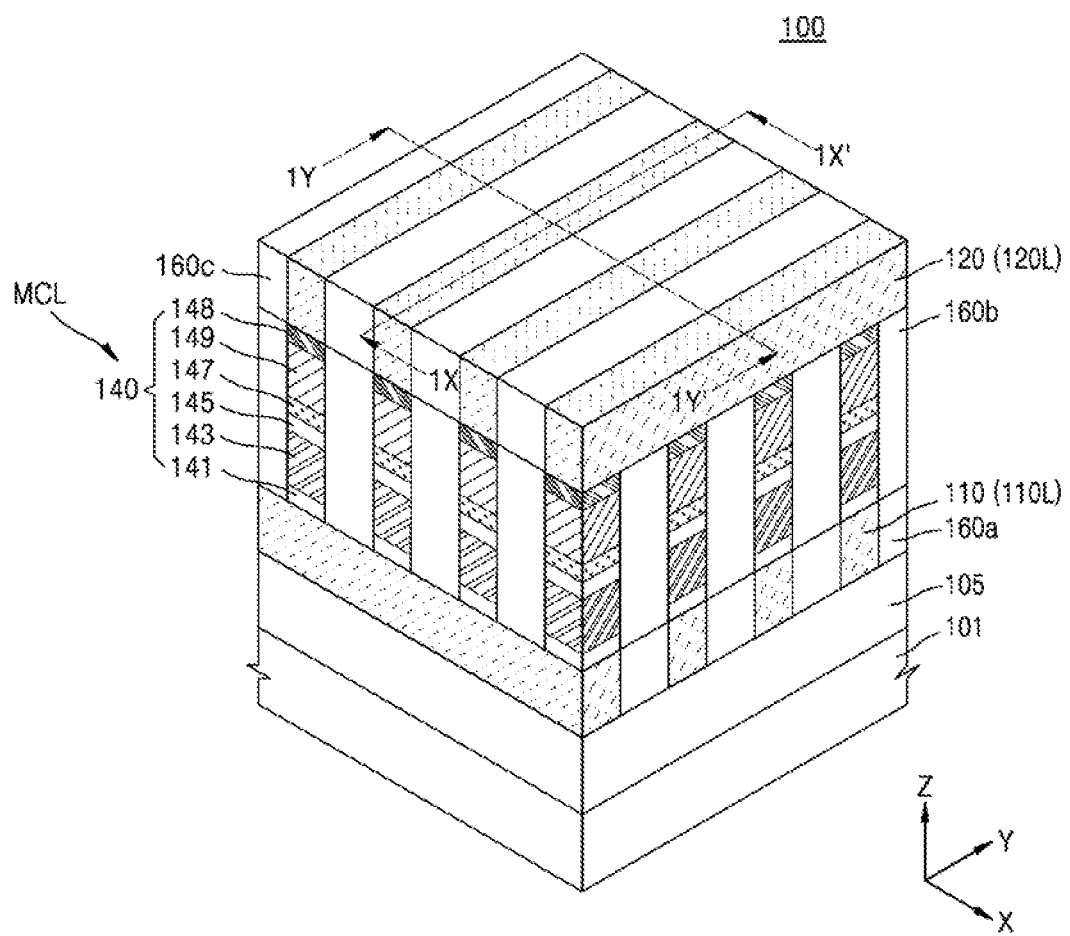
FIG. 2 is a perspective view of a memory device according to an exemplary embodiment of the present inventive concept.
Figure 3:
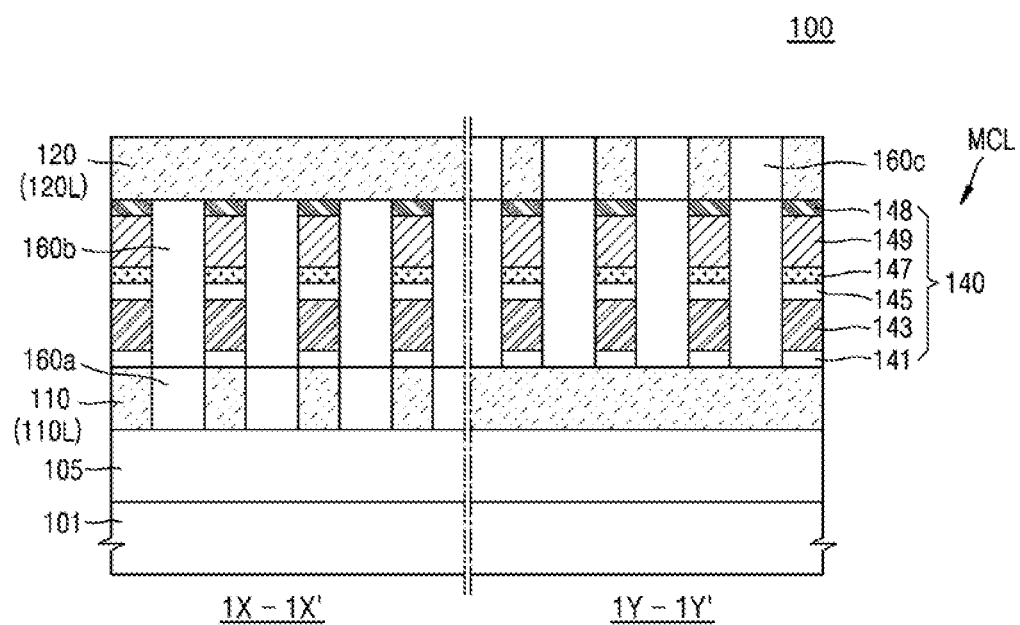
FIG. 3 is a cross-sectional view taken along lines 1X-1X' and 1Y-1Y' of FIG. 2.

FIG. 2 is a perspective view of a memory device according to an exemplary embodiment of the present inventive concept. FIG. 3 is a cross-sectional view taken along lines 1X-1X' and 1Y-1Y' of FIG. 2.

Referring to FIGS. 2 and 3, the memory device 100 may include a first electrode line layer 110L, a second electrode line layer 120L, and a memory cell layer MCL on a substrate 101.

An insulating interlayer 105 may be disposed on the substrate 101. The insulating interlayer 105 may include a silicon oxide material or a silicon nitride material, and may electrically separate the first electrode line layer 110L from the substrate 101. In the memory device 100 according to an exemplary embodiment of the present inventive concept, the insulating interlayer 105 is disposed on the substrate 101; however, exemplary embodiments of the present inventive concept are not limited thereto. For example, in the memory device 100 according to an exemplary embodiment of the present inventive concept, an integrated circuit layer may be disposed on the substrate 101, and memory cells may be disposed on the integrated circuit layer. The integrated circuit layer may include, for example, a peripheral circuit for driving the memory cells and/or a core circuit for performing operations. A structure, in which the integrated circuit layer including the peripheral circuit and/or the core circuit is disposed on the substrate and the memory cells are positioned above the integrated circuit layer, may be referred to as a cell over periphery (COP) structure.

The first electrode line layer 110L may include a plurality of first electrode lines 110 that extend along the first direction (e.g., the X direction) in parallel with one another. The second electrode lines 120L may include a plurality of second electrode lines 120 that extend in the second direction (e.g., the Y direction) crossing the first direction in parallel with one another. The first direction and the second direction may be perpendicular to each other.

Referring to driving of the memory device 100, the first electrode lines 110 may be in a position corresponding to the word lines WL (see, e.g., FIG. 1), and the second electrode lines 120 may be in a position corresponding to the bit lines BL (see, e.g., FIG. 1). According to an exemplary embodiment of the present inventive concept, the first electrode lines 110 may be in a position corresponding to the bit lines, and the second electrode lines 120 may be in a position corresponding to the word lines.

The first electrode lines 110 and the second electrode lines 120 may each include a metal, a conductive metal nitride, a conductive metal oxide, or a combination thereof. For example, the first electrode lines 110 and the second electrode lines 120 may each include W, WN, Au, Ag, Cu, Al, TiAlN, Ir, Pt, Pd, Ru, Zr, Rh, Ni, Co, Cr, Sn, Zn, indium tin oxide (ITO), an alloy thereof, or a combination thereof. In addition, the first electrode line 110 and the second electrode lines 120 may each include a metal layer, and a conductive barrier layer at least partially covering the metal layer. The conductive barrier layer may include, for example, Ti, TiN, Ta, TaN, or a combination thereof.

The memory cell layer MCL may include a plurality of memory cells 140 (see, e.g., MC of FIG. 1) that are spaced apart from one another in the first direction and the second direction. Referring to FIGS. 2 and 3, the first electrode lines 110 and the second electrode lines 120 may cross each other (e.g., may be perpendicular to each other). The memory cells 140 may be positioned where the first electrode lines 110 and the second electrode lines 120 cross each other, between the first electrode line layer 110L and the second electrode line layer 120L.

The memory cells 140 may each have square pillar structures; however, exemplary embodiments of the present inventive concept are not limited thereto. For example, the memory cells 140 may each have various types of pillar shapes such as cylinders, oval pillars, and polygonal pillars. The memory cells 140 may each have a structure, in which a lower portion is wider than an upper portion, or a structure, in which an upper portion is wider than a lower portion. As an example, when the memory cells 140 may be formed by performing an etching process, a lower portion of each memory cell 140 may be wider than an upper portion thereof. As an example, the memory cells 140 may be formed by performing a damascene process, and thus an upper portion of each memory cell 140 may be wider than a lower portion thereof. During the etching process or the damascene process, the etching may be controlled accurately so that material layers may be etched to have nearly vertical side surfaces, and the upper and lower portions are nearly the same as each other in terms of width. Referring to, for example, FIGS. 2 and 3, the memory cells 140 may have vertical side surfaces; however, exemplary embodiments of the present inventive concept are not limited thereto. For example, the memory cells 140 may each have a structure, in which the lower portion is wider than the upper portion or the upper portion is wider than the lower portion.

Each of the memory cells 140 may include a lower electrode layer 141, a selection device layer 143, an intermediate electrode layer 145, a heating electrode layer 147, a variable resistance layer 149, and an upper electrode layer 148. Without taking into account locations of the above layers, the lower electrode layer 141 may be referred to as a first electrode layer, the intermediate electrode layer 145 and the heating electrode layer 147 may be referred to as a second electrode layer, and the upper electrode layer 148 may be referred to as a third electrode layer.

In an exemplary embodiment of the present inventive concept, the variable resistance layer 149 (see, e.g., ME of FIG. 1) may include a phase change material that reversibly changes between an amorphous state and a crystalline state. For example, the variable resistance layer 149 may include a material, of which a phase may be reversibly changed due to Joule heat generated by voltages applied to opposite terminals of the variable resistance layer 149 and of which a resistance varies depending on the phase change. As an example, the phase change material may be in a high resistance state when it is in the amorphous phase, and in a low resistance state when it is in the crystalline phase. By defining the high resistance state as '0' and the low resistance state as '1', data may be stored in the variable resistance layer 149.

In an exemplary embodiment of the present inventive concept, the variable resistance layer 149 may include a chalcogenide material as the phase change material. For example, the variable resistance layer 149 may include Ge—Sb—Te (GST). Herein, a chemical composition expression with hyphens (—) may express elements included in a certain mixture or a compound, and may denote any kind of chemical formula structure including the expressed elements. For example, Ge—Sb—Te may include $Ge_2Sb_2Te_5$, $Ge_2Sb_2Te_7$, $Ge_1Sb_2Te_4$, or $Ge_1Sb_4Te_7$.

The variable resistance layer 149 may include various chalcogenide materials, in addition to the above-described Ge—Sb—Te (GST). For example, the variable resistance layer 149 may include at least two selected from silicon (Si), germanium (Ge), antimony (Sb), tellurium (Te), bismuth (Bi), indium (In), tin (Sn), or selenium (Se), or a combination thereof, as the chalcogenide material.

Each element included in the variable resistance layer 149 may have various stoichiometric ratios. A crystallization temperature, a melting point, a phase shift speed according to crystallization energy, and data retention of the variable resistance layer 149 may be adjusted according to the stoichiometry of each element. In an exemplary embodiment of the present inventive concept, a melting point of the chalcogenide material included in the variable resistance layer 149 may be from about 500° C. to about 800° C.

The variable resistance layer 149 may further include at least one impurity selected from boron (B), carbon (C), nitrogen (N), oxygen (O), phosphor (P), or sulfur (S). A driving current of the memory device 100 may vary depending on the impurity. The variable resistance layer 149 may further include a metal. For example, the variable resistance layer 149 may include at least one selected from aluminum (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), or polonium (Po). Such above metal materials may increase electric conductivity and thermal conductivity of the variable resistance layer 149, thus increasing a crystallization speed and setting speed. In addition, the metal materials may increase the data retention property of the variable resistance layer 149.

The variable resistance layer 149 may have a multi-layered structure, in which two or more layers having different physical properties from each other are stacked. The number of layers or a thickness of each layer may be selected, as desired. A barrier layer may be further formed between the layers. The barrier layer may prevent materials from diffusing among the plurality of layers. For example, the barrier layer may reduce diffusion of a preceding layer when a successive layer is formed, from among the plurality of layers.

The variable resistance layer 149 may have a super-lattice structure in which a plurality of layers including different materials from one another are alternatingly stacked. For example, the variable resistance layer 149 may have a structure, in which a first layer including Ge—Te and a second layer including Sb—Te are alternatingly stacked. However, the first layer and the second layer are not limited thereto, and the first and second layers may include the various above-described materials.

In the above description, the phase change material is exemplarily provided as the variable resistance layer 149, but exemplary embodiments of the present inventive concept are not limited thereto. The variable resistance layer 149 of the memory device 100 may include various materials having variable resistance characteristics.

In an exemplary embodiment of the present inventive concept, if the variable resistance layer 149 includes a transition metal oxide, the memory device 100 may be a resistive random access memory (ReRAM). In the variable resistance layer 149 including the transition metal oxide, at least one electrical path may be generated or extinguished by a programming operation. When the electrical path is generated, the variable resistance layer 149 may have a low resistance value, and when the electrical path is extinguished, the variable resistance layer 149 may have a high resistance value. The memory device 100 may store data by using such a difference between the resistance values of the variable resistance layer 149.

When the variable resistance layer 149 includes the transition metal oxide, the transition metal oxide may include at least one metal selected from Ta, Zr, Ti, Hf, Mn, Y, Ni, Co, Zn, Nb, Cu, Fe, or Cr. For example, the transition metal oxide may have a single-layered structure or a multi-layered structure including at least one selected from $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, or $Fe_2O_{3-x}$. In the above examples, x and y may be respectively selected within a range of $0 \leq x \leq 51.5$ or a range of $0 \leq y \leq 0.5$; however, exemplary embodiments of the present inventive concept are not limited thereto.

In an exemplary embodiment of the present inventive concept, when the variable resistance layer 149 has a magnetic tunnel junction (MRJ) structure including two electrodes formed of magnetic materials, and a dielectric material positioned between the two electrodes of the magnetic materials, the memory device 100 may be a magnetic RAM (MRAM).

The above two electrodes may be respectively a pinned magnetization layer and a free magnetization layer, and the dielectric material positioned between the two electrodes may be a tunnel barrier layer. The pinned magnetization layer has a magnetization direction fixed in a certain direction, and the free magnetization layer has a magnetization direction that is either parallel or anti-parallel with the magnetization direction of the pinned magnetization layer. The magnetization directions of the pinned magnetization layer and the free magnetization layer may be in parallel with a surface of the tunnel barrier layer. Alternatively, the magnetization directions of the pinned magnetization layer and the free magnetization layer may be perpendicular to the surface of the tunnel barrier layer.

In a case where the magnetization direction of the free magnetization layer is in parallel with the magnetization direction of the pinned magnetization layer, the variable resistance layer 149 may have a first resistance value. In a case where the magnetization direction of the free magnetization layer is in anti-parallel with the magnetization direction of the pinned magnetization layer, the variable resistance layer 149 may have a second resistance value. By using the variation in the resistance value, the memory device 100 may store data. The magnetization direction of the free magnetization layer may be changed by spin torque of electrons in a programming current.

The pinned magnetization layer and the free magnetization layer may have a magnetic material. The pinned magnetization layer may further include an anti-ferromagnetic material for fixing the magnetization direction of a ferromagnetic material in the pinned magnetization layer. The tunnel barrier layer may include an oxide material of any one selected from Mg, Ti, Al, MgZn, and MgB, but is not limited thereto.

The selection device layer 143 (e.g., SW of FIG. 1) may be a current adjustment layer that may control a flow of the electric current. The selection device layer 143 may include a material layer, of which a resistance may vary depending on a magnitude of a voltage applied to opposite terminals of the selection device layer 143. For example, the selection device layer 143 may include an Ovonic threshold switching (OTS) material. Functions of the selection device layer 143 based on the OTS material will be described in more detail below. As an example, when a voltage that is less than a threshold voltage V-r is applied to the selection device layer 143, the selection device layer 143 is maintained at a high resistance state, and thus electric current rarely flows through the selection device layer 143. When a voltage that is greater than the threshold voltage $V_T$ is applied to the selection device layer 143, the selection device layer 143 enters the low resistance state and the electric current starts to flow. When the electric current flowing through the selection device layer 143 is less than a holding current, the selection device layer 143 may shift to the high resistance state. An Ovonic threshold switching characteristic of the selection device layer 143 will be described in more detail below with reference to FIG. 4.

The selection device layer 143 may include a chalcogenide switching material as the OTS material. In an exemplary embodiment of the present inventive concept, the selection device layer 143 may include a ternary chalcogenide switching material including Ge, Se, and Te, and optionally, the ternary chalcogenide switching material may further include an additive element (X). For example, the selection device layer 143 may include a chalcogenide switching material having a composition according to chemical formula 1 below.

$$[Ge_A Se_B Te_C]_{(1-U)}[X]_U \quad (1)$$

where $0.20 \leq A \leq 0.40$, $0.40 \leq B \leq 0.70$, $0.05 \leq C \leq 0.25$, A+B+C=1, $0.0 \leq U \leq 0.20$, and X is at least one selected from boron (B), carbon (C), nitrogen (N), oxygen (O), phosphorus (P), or sulfur (S).)

In an exemplary embodiment of the present inventive concept, the ternary chalcogenide switching material may include Ge in an amount of about 20 atomic percent (at %) to about 40 at % (for example, A may be about 0.20 to about 0.40 in the chemical formula 1 above). A chalcogenide switching material having a composition of $Ge_A Se_B Te_C$ may be referred to as the ternary chalcogenide switching material. For example, the chalcogenide switching material having the composition according to the chemical formula 1 may further include an additive element (X) in addition to the ternary chalcogenide switching material. In some examples, the ternary chalcogenide switching material may include Ge in an amount of about 25 at % to about 35 at % (for example, A may be about 0.25 to about 0.35 in the chemical formula 1 above).

Thermal stability of the chalcogenide switching material may be increased and stable switching characteristics may be exhibited when Ge is included in the chalcogenide switching material. When the ternary chalcogenide switching material includes Ge in an amount less than about 20 at %, the thermal stability of the chalcogenide switching material may be relatively low. For example, when the ternary chalcogenide switching material includes Ge in an amount less than about 20 at %, the ternary chalcogenide switching material may have a low volatilization temperature equal to or less than about 150° C., and thus, the thermal stability might not be sufficiently high enough to be used in the memory device having a cross-point structure. When the ternary chalcogenide switching material includes Ge in an amount greater than about 40 at %/o, the chalcogenide switching material might not exhibit a stable switching characteristic. For example, when the ternary chalcogenide switching material includes Ge in an amount greater than about 40 at %, a crystallization temperature of the chalcogenide switching material is lowered, and thus, leakage current of the chalcogenide switching material may increase or a switch might not be turned off, and thus the chalcogenide switching material might not exhibit stable switching characteristics.

In an exemplary embodiment of the present inventive concept, the ternary chalcogenide switching material may include Se in an amount of about 40 at % to about 70 at % (for example, B may be about 0.40 to about 0.70 in the chemical formula 1 above). In an exemplary embodiment of the present inventive concept, the ternary chalcogenide switching material may include Se in an amount of about 45 at % to about 65 at % (for example, B may be about 0.45 to about 0.65 in the chemical formula 1 above). When a predetermined amount of Se is included in the chalcogenide switching material, leakage current (or off-current) of the chalcogenide switching material may be reduced. For example, when the ternary chalcogenide switching material includes Se in an amount greater than about 40 at %, the off-current of the chalcogenide switching material may be reduced. When the ternary chalcogenide switching material includes Se in an amount exceeding about 70 at %, a content amount of Ge that may be included in the ternary chalcogenide switching material for implementing stable switching characteristics may be reduced, and thus the thermal stability of the chalcogenide switching material may be decreased.

In an exemplary embodiment of the present inventive concept, the ternary chalcogenide switching material may include Te in an amount of about 5 at % to about 25 at % (for example, C may be about 0.05 to about 0.25 in the chemical formula 1 above). In an exemplary embodiment of the present inventive concept, the ternary chalcogenide switching material may include Te in an amount of about 10 at % to about 20 at % (for example, C may be about 0.10 to about 0.20 in the chemical formula 1 above). When a predetermined amount of Te is included in the chalcogenide switching material, the durability of the chalcogenide switching material may be increased and stable switching characteristics may be exhibited. For example, when the ternary chalcogenide switching material includes Te in an amount greater than about 5 at %, the durability of the chalcogenide switching material may be increased. When the ternary chalcogenide switching material includes Te in an amount exceeding about 25 at %, leakage current of the chalcogenide switching material may increase or a switch might not be turned off, and thus the chalcogenide switching material might not exhibit stable switching characteristics.

The ternary chalcogenide switching material according to an exemplary embodiment of the present inventive concept might not include Si. When the chalcogenide switching material includes Si, it may be difficult to form the selection device layer 143 having relatively high film quality. For example, to form the selection device layer 143, the chalcogenide switching material may be sintered to form a target, and for example, a film including the chalcogenide switching material may be formed on a substrate from the target by impact of argon gas using a physical vapor deposition (PVD) process. However, when the chalcogenide switching material includes Si, silicon particles may agglomerate and be separated in the target during the target formation process or pores are formed in the target, and thus silicon particles in the selection device layer 143 may agglomerate and be separated. Thus, the selection device layer 143 may have a non-uniform composition distribution and/or a non-uniform thickness, and the film quality of the selection device layer 143 may deteriorate. However, the ternary chalcogenide switching material according to an exemplary embodiment of the present inventive concept might not include Si, and thus, a relatively high quality target may be formed and a selection device layer 143 formed using the target may have relatively high film quality.

The ternary chalcogenide switching material according to an exemplary embodiment of the present inventive concept might not include Sb. When the chalcogenide switching material includes Sb, a crystallization temperature of the chalcogenide switching material may be reduced. Thus, the thermal stability of the chalcogenide switching material may be degraded, and the chalcogenide switching material may be damaged or deteriorated in a process for manufacturing a memory device having a cross-point structure by using the chalcogenide switching material. However, the ternary chalcogenide switching material according to an exemplary embodiment of the present inventive concept might not include Sb, and the ternary chalcogenide switching material may have relatively high thermal stability.

In an exemplary embodiment of the present inventive concept, the chalcogenide switching material may further include an additive element (X) in an amount of about 0 at % to about 20 at % as shown in the chemical formula 1 above (e.g., U may be about 0.0 to about 0.2 in the chemical formula 1 above). In an exemplary embodiment of the present inventive concept, the chalcogenide switching material may further include B in an amount of about 0.1 at % to about 20 at % as the additive element (X), further include C in an amount of about 0.1 at % to about 10 at % as the additive element (X), further include N in an amount of about 8 at % to about 20 at % as the additive element (X), further include P in an amount of about 0.1 at % to about 8 at % as the additive element (X), or further include S in an amount of about 0.1 at % to about 8 at % as the additive element (X). When the chalcogenide switching material includes the additive element (X), the content amount of each of Ge, Se, or Te in the chalcogenide switching material may be reduced according to the amount of additive element (X).

In an exemplary embodiment of the present inventive concept, the selection device layer 143 may include a chalcogenide switching material that includes Ge, Se, or Te and further includes Arsenic (As). For example, the selection device layer 143 may include the chalcogenide switching material having a composition according to chemical formula 2 below.

$$[Ge_A Se_B Te_C As_D]_{(1-U)}[X]_U \qquad (2)$$

where $0.20 \leq A \leq 0.35$, $0.45 \leq B \leq 0.65$, $0.04 \leq C \leq 0.18$, $0.0 \leq D \leq 0.18$, $A+B+C+D=1$, $0.0 \leq U \leq 0.20$, and X is at least one selected from B, C, N, O, P, or S.)

In an exemplary embodiment of the present inventive concept, the chalcogenide switching material may include As in an amount of about 0 at % to about 18 at %, as in chemical formula 2, for example (e.g., D may be about 0.0 to about 0.18 in the chemical formula 2). In an exemplary embodiment of the present inventive concept, the chalcogenide switching material may include Ge in an amount of about 20 at % to about 30 at %, Sc in an amount of about 45 at % to about 60 at %, Te in an amount of about 4 at % to about 18 at %, and As in an amount of about 4 at % to about 18 at % (e.g., in chemical formula 2, A may be about 0.20 to about 0.30, B may be about 0.45 to about 0.60, C may be about 0.04 to about 0.18, and D may be about 0.04 to about 0.18).

As included in the chalcogenide switching material may increase thermal stability of the chalcogenide switching material. For example, As may increase a volatilization temperature and/or a crystallization temperature of the chalcogenide switching material, and thus the thermal stability of the selection device layer 143 including the chalcogenide switching material may be increased. For example, the chalcogenide switching material may have a relatively high volatilization temperature and a relatively high crystallization temperature, and thus damage to the chalcogenide switching material or degradation of the chalcogenide switching material may be prevented during processes of manufacturing a memory device having a cross-point structure by using the chalcogenide switching material. In addition, the leakage current characteristic and the thermal stability of the chalcogenide switching material according to an exemplary embodiment of the present inventive concept will be described in more detail below with reference to FIGS. 6A to 6C.

The selection device layer 143 may include the chalcogenide switching material having the composition according to chemical formula 1 or 2 above. Since the chalcogenide switching material does not include Si, the chalcogenide switching material may have relatively high film quality. In addition, the chalcogenide switching material may have stable switching characteristics, low off-current, relatively high thermal stability, and relatively high durability.

The heating electrode layer 147 may be disposed between the intermediate electrode layer 145 and the variable resistance layer 149, and may be in direct contact with the variable resistance layer 149. The heating electrode layer 147 may heat the variable resistance layer 149 during a set or reset operation. The heating electrode layer 147 may include a conductive material that may generate heat that is sufficient enough to cause a phase change of the variable resistance layer 149 without reacting with the variable resistance layer 149. The heating electrode layer 149 may include a carbon-based conductive material. In an exemplary embodiment of the present inventive concept, the heating electrode layer 147 may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, silicon carbide (SiC), silicon carbon nitride (SiCN), carbon nitride (CN), titanium carbon nitride (TiCN), tantalum carbon nitride (TaCN), a refractory metal combination or nitride thereof. However, the heating electrode layer 147 is not limited to the above examples.

The lower electrode layer 141, the intermediate electrode layer 145, and the upper electrode layer 148 may function as current paths, and may include a conductive material. For example, the lower electrode layer 141, the intermediate electrode layer 145, and the upper electrode layer 148 may each include a metal, a conductive metal nitride, a conductive metal oxide, or a combination thereof. For example, the lower electrode layer 141, the intermediate electrode layer 145, and the upper electrode layer 148 may each include at least one selected from C, TiN, TiSiN, TiCN, TiCSiN, TiAlN, Ta, TaN, W, or WN; however, exemplary embodiments of the present inventive concept are not limited thereto.

The lower electrode layer 141 and the upper electrode layer 148 may be optionally formed. As an example, the lower electrode layer 141 and the upper electrode layer 148 may be omitted. However, to prevent contamination or defective contact that may be caused when the selection device layer 143 and the variable resistance layer 149 directly contact the first and second electrode lines 110 and 120, the lower electrode layer 141 and the upper electrode layer 148 may be positioned between the first and second electrode lines 110 and 120 and the selection device layer 143 and the variable resistance layer 149.

The intermediate electrode layer 145 may prevent heat from transferring to the selection device layer 143 from the heating electrode layer 147. As an example, the selection device layer 143 may include a chalcogenide switching material in an amorphous state. However, according to a down-scaling tendency of the memory device 100, a thickness and a width of each of the variable resistance layer 149, the selection device layer 143, the heating electrode layer 147, and the intermediate electrode layer 145 and distances therebetween may be reduced. Thus, while driving the memory device 100, when the heating electrode layer 147 generates heat to cause the phase change of the variable resistance layer 149, the selection device layer 143 positioned adjacent to the heating electrode layer 147 may be affected by the heat. For example, the selection device layer 143 may be partially crystallized by the heat from the adjacent heating electrode layer 147, and thus the selection device layer 143 may be degraded or damaged. In an exemplary embodiment of the present inventive concept, the intermediate electrode layer 145 may be relatively thick so as not to transfer the heat from the heating electrode layer 147 to the selection device layer 143. Referring to FIGS. 2 and 3, the intermediate electrode layer 145 may have a thickness that is similar to that of the lower electrode layer 141 or the upper electrode layer 148, but the thickness of the intermediate electrode layer 145 may be greater than that of the lower electrode layer 141 or the upper electrode layer 148 for facilitating the heat blocking operation. For example, the intermediate electrode layer 145 may have a thickness of about 10 nm to about 100 nm; however, exemplary embodiments of the present inventive concept are not limited thereto.

In an exemplary embodiment of the present inventive concept, the intermediate electrode layer 145 may include at least one thermal barrier layer for the heat blocking function. When the intermediate electrode layer 145 includes two or more thermal barrier layers, the intermediate electrode layer 145 may have a structure, in which the thermal barrier layers and electrode material layers are alternatingly stacked.

A first insulating layer 160a may be positioned between adjacent first electrode lines 110, and a second insulating layer 160b may be positioned between adjacent memory cells 140 of the memory cell layer MCL. In addition, a third insulating layer 160c may be positioned between adjacent second electrode lines 120. The first to third insulating layers 160a to 160c may be insulating layers including a same material as each other, or at least one of the first to third insulating layers 160a to 160c may include a material different from that of the other first to third insulating layers 160a to 160c. The first to third insulating layers 160a to 160c may each include a dielectric material of, for example, an oxide material or a nitride material, and may electrically isolate devices from one another in each layer. An air gap may be formed instead of the second insulating layer 160b. When the air gap is formed, an insulating liner having a predetermined thickness may be formed between the air gap and the memory cells 140.

As an example, in a memory device using the chalcogenide material as a selection device, the chalcogenide material may have a relatively low crystallization temperature, and thus general processes for manufacturing memory devices might not be performed and it may be difficult to manufacture a memory device having a three-dimensional (3D) cross-point stack structure. Since the chalcogenide material has a relatively large off-current, the number of memory cells that are operated at once is reduced and durability may be relatively low.

However, the memory device 100 according to an exemplary embodiment of the present inventive concept may include the selection device layer 143 including a chalcogenide switching material having a composition according to chemical formula 1 or 2, and the chalcogenide switching material may exhibit stable switching characteristics, low off-current, relatively high thermal stability, and relatively high durability. Thus, the memory device 100 may have a 3D cross-point stack structure having relatively high reliability.

Figure 4:
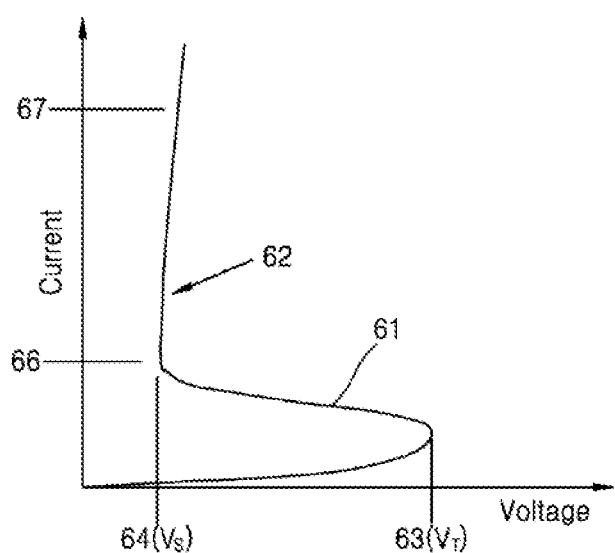
FIG. 4 is a graph schematically showing a voltage-current curve of a selection device layer having an Ovonic threshold switching characteristic.

FIG. 4 is a graph schematically showing a voltage-current curve of a selection device layer having an Ovonic threshold switching characteristic.

Referring to FIG. 4, a first curve 61 denotes a voltage-current relationship in a state where an electric current does not flow through the selection device layer 143 (see, e.g., FIG. 3). Here, the selection device layer 143 may function as a switching device having a threshold voltage $V_T$ of a first voltage level 63. When a voltage gradually increases from a state where the voltage and the current are 0, the electric current may rarely flow on the selection device layer 143 until the voltage reaches the threshold voltage $V_T$, that is, the first voltage level 63. However, once the voltage exceeds the threshold voltage $V_T$, the electric current flowing on the selection device layer 143 may greatly increase, and the voltage applied to the selection device layer 143 may decrease to a saturated voltage Vs (that is, a second voltage level 64).

A second curve 62 denotes a voltage-current relationship in a state where the electric current flows in the selection device layer 143. When the electric current flowing in the selection device layer 143 is greater than a first current level 66, a voltage applied to the selection device layer 143 may be slightly increased greater than the second voltage level 64. For example, while the electric current flowing in the selection device layer 143 increases from the first current level 66 to a second current level 67, the voltage applied to the selection device layer 143 may be slightly increased from the second voltage level 64. That is, once the electric current flows through the selection device layer 143, the voltage applied to the selection device layer 143 may be mainly maintained at the saturated voltage Vs. If the electric current decreases to a retention current level (e.g., the first current level 66) or less, the selection device layer 143 is switched to a resistor state to effectively block the electric current until the voltage increases to the threshold voltage V.

Referring to FIG. 4, when the memory device is in a turn-off state (e.g., a state where a predetermined voltage less than the threshold voltage $V_T$ is applied), a small amount of electric current may flow. As the leakage current in the off-state becomes greater, the number of memory cells that may be operated at once is reduced and stable switching characteristics might not be obtained, and thus it may be difficult to implement the memory device having the 3D cross-point structure. However, the selection device layer 143 according to an exemplary embodiment of the present inventive concept may include the chalcogenide switching material having the composition according to chemical formulas 1 or 2. Thus, the selection device layer 143 may have stable switching characteristics and low off-current, and the memory device 100 may have the 3D cross-point stack structure having relatively high reliability.

A memory device including the chalcogenide switching material according to an exemplary embodiment of the present inventive concept will be described in more detail below with reference to FIGS. 5, and 6A to 6C.

Figure 5:
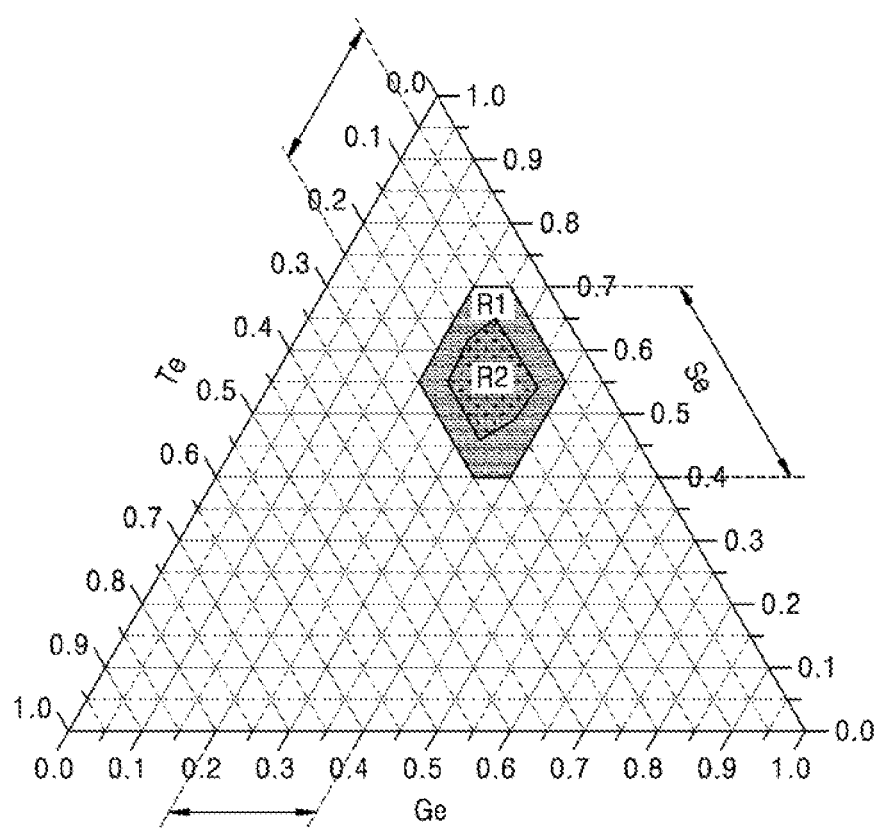
FIG. 5 is a ternary phase diagram showing a composition range of a chalcogenide switching material according to an exemplary embodiment of the present inventive concept.

FIG. 5 is a ternary phase diagram showing a composition range of a chalcogenide switching material according to an exemplary embodiment of the present inventive concept.

Referring to FIG. 5, the chalcogenide switching material according to an exemplary embodiment of the present inventive concept may have a first composition range R1 and a second composition range R2 according to the chemical formula 1. For example, the first composition range R1 may correspond to a composition of a ternary chalcogenide switching material including Ge in an amount of about 20 at % to about 40 at %, Se in an amount of about 40 at % to about 70 at %, and Te in an amount of about 5 at % to about 25 at %, and the second composition range R2 may correspond to a composition of a ternary chalcogenide switching material including Ge in an amount of about 25 at % to about 35 at %, Se in an amount of about 45 at % to about 65 at %, and Te in an amount of about 10 at % to about 20 at %.

Figure 6A:
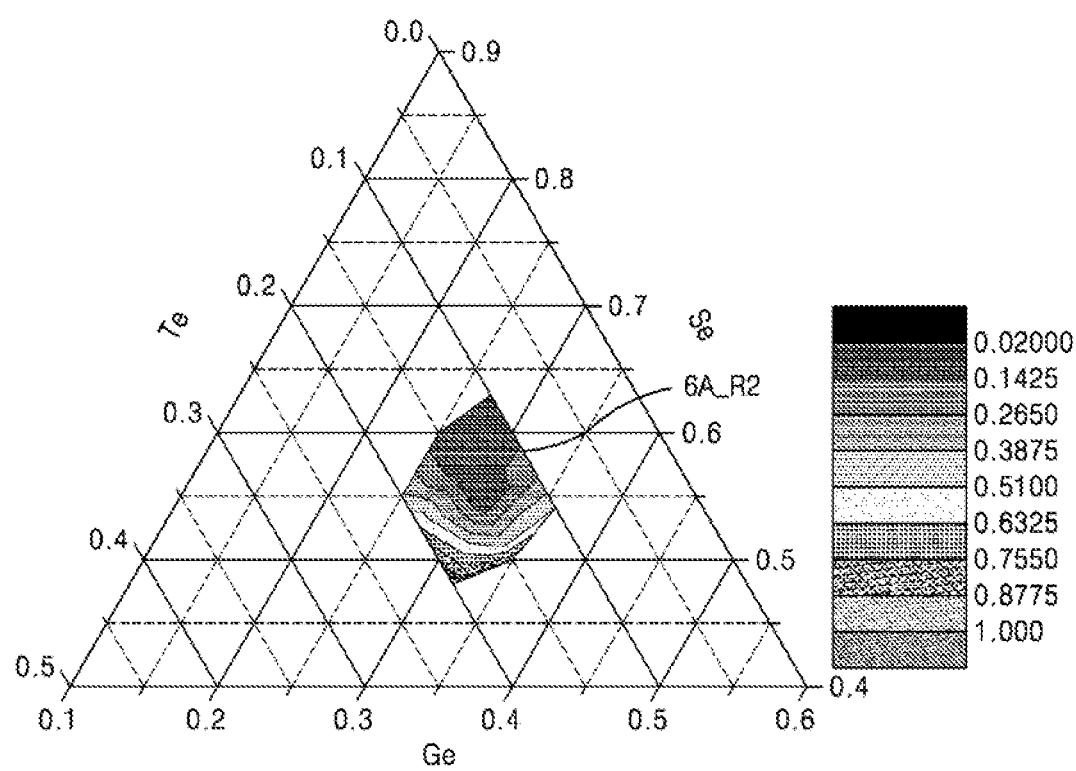
FIGS. 6A to 6C are graphs showing characteristics of memory devices including a chalcogenide switching material according to an exemplary embodiment of the present inventive concept.
Figure 6B:
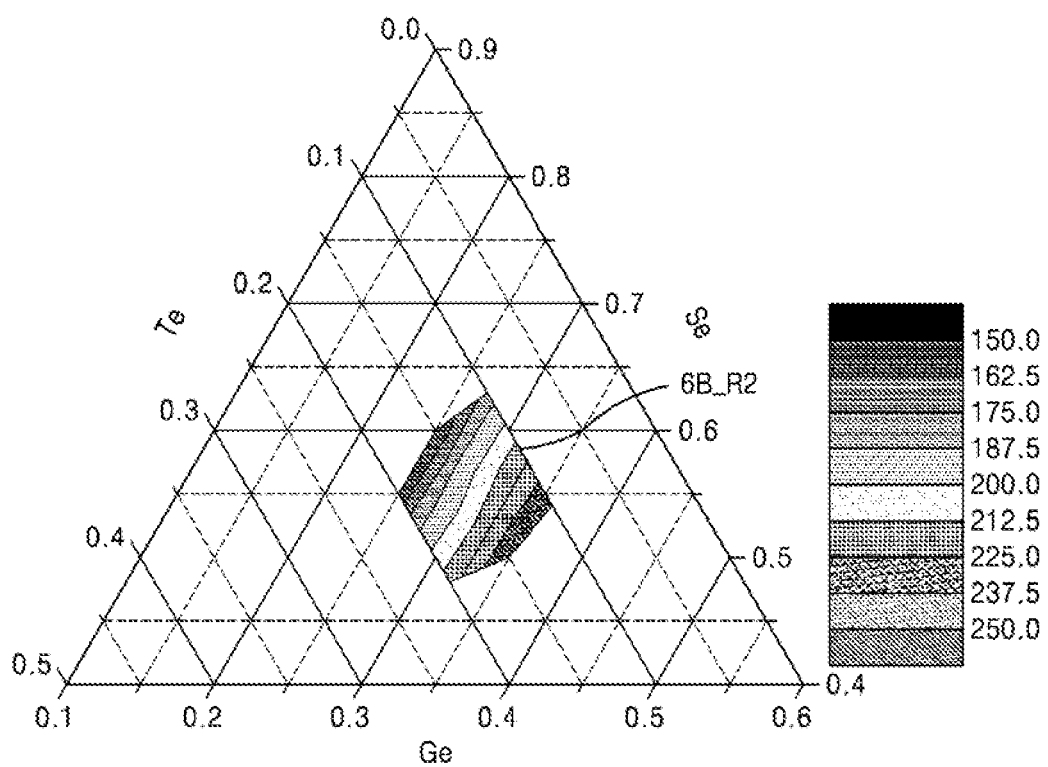
Figure 6C:
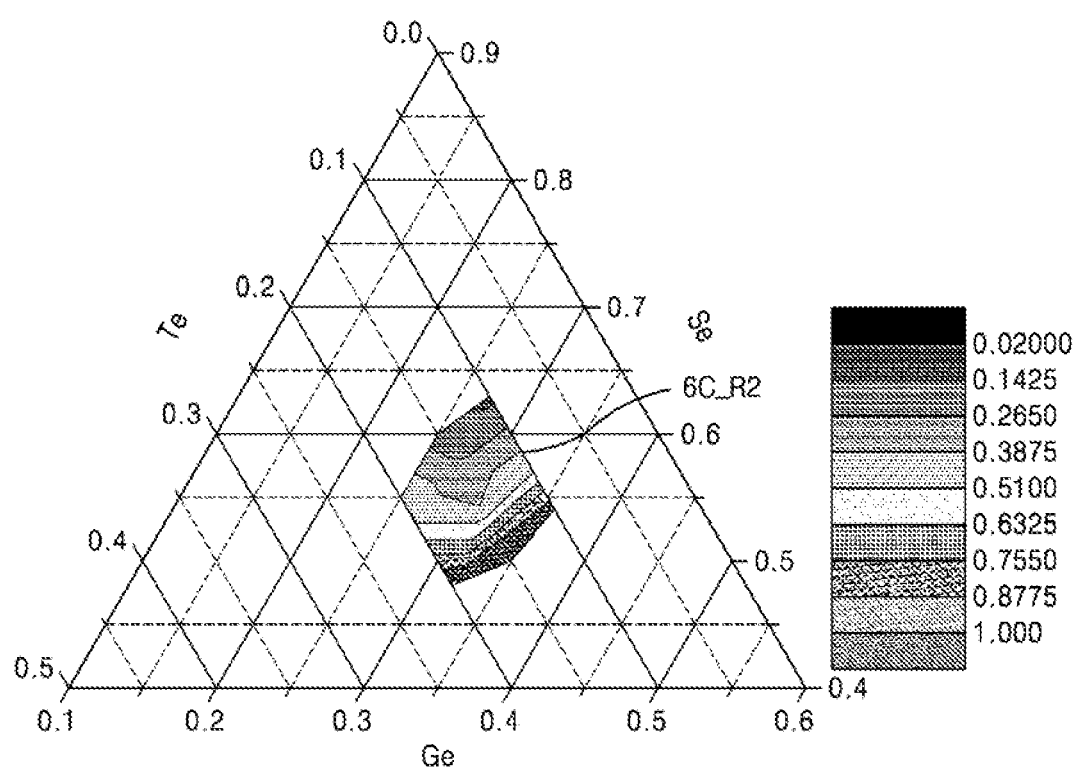

FIGS. 6A to 6C are graphs showing characteristics of memory devices including a chalcogenide switching material according to an exemplary embodiment of the present inventive concept.

An off current 6A_R2, a volatilization temperature 6B_R2, and durability 6C_R2 of a ternary chalcogenide switching material having the second composition range R2 are shown in FIGS. 6A to 6C, respectively. In FIGS. 6A to 6C, the respective values of the off current 6A_R2, the volatilization temperature 6B_R2, and the durability 6C_R2 are described as arbitrary units.

Referring to FIG. 6A, a ternary chalcogenide switching material having the second composition range R2 may exhibit a relativity low off-current over substantially the whole area of the composition range of the ternary chalcogenide switching material. For example, the ternary chalcogenide switching material having the second composition range R2 may have an off-current of several tens of pA, which may be significantly lower than an off-current that may be obtained through a chalcogenide material having conventional Ovonic threshold switching (OTS) characteristics. Further, the off-current of several tens of pA may correspond to a relatively low level current that may be obtained in a conventional diode type-switching device.

Referring to FIGS. 6B and 6C, the ternary chalcogenide switching material having the second composition range R2 may exhibit relatively high thermal stability and durability. For example, referring to FIG. 6B, a volatilization temperature of the ternary chalcogenide switching material may increase as a content amount of Ge increases from about 20 at % to about 40 at %.

Referring also to FIG. 6C, the durability of the ternary chalcogenide switching material may be increased as a content amount of Te increases from about 5 at % to about 25 at % and/or a content amount of Ge increases from about 20 at % to about 40 at %.

The chalcogenide switching material according to an exemplary embodiment of the present inventive concept may include Ge in an amount of about 20 at % to 40 at %, Se in an amount of about 40 at % to about 70 at %, and Te in an amount of about 5 at % to about 25 at %. The chalcogenide switching material may have relatively high thermal stability and low off-current since the chalcogenide switching material includes Ge in an amount of about 20 at % to 40 at %, and may have a reduced off-current since the chalcogenide switching material includes Se in an amount of about 40 at % to about 70 at %, and may have increased durability since the chalcogenide switching material includes Te in an amount of about 5 at % to about 25 at %. In addition, the chalcogenide switching material does not include Si, and thus, the selection device layer 143 having relatively high film quality may be formed. Thus, the memory device may exhibit relatively low off-current, relatively high thermal stability, and relatively high excellent reliability.

FIGS. 7 to 10 are each cross-sectional views of memory devices according an exemplary embodiment of the present inventive concept. Descriptions that are the same as those described above with reference to FIGS. 2 and 3 may be omitted below.

Figure 7:
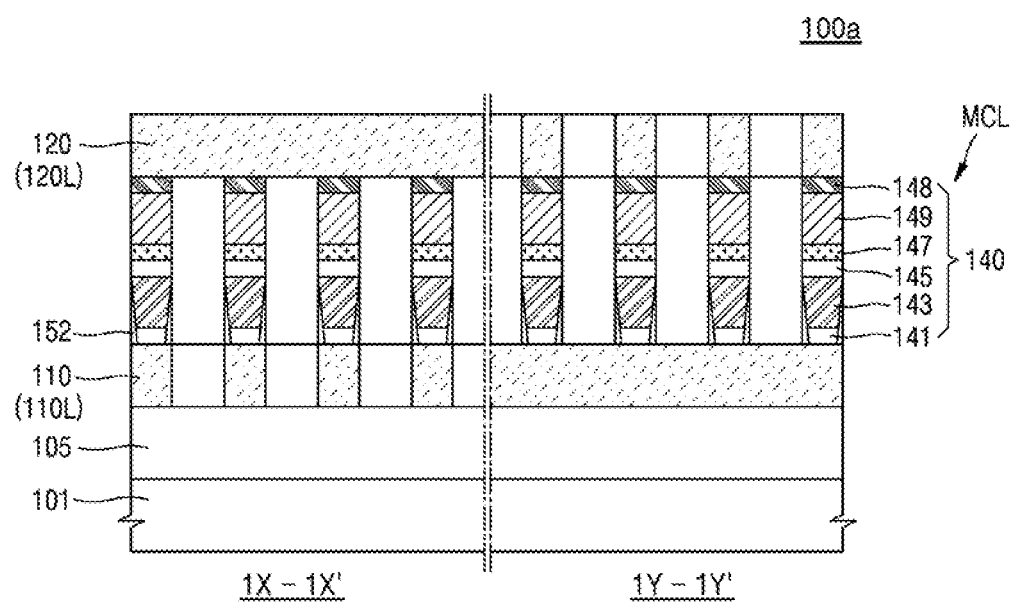
FIGS. 7 to 10 are each cross-sectional views of memory devices according an exemplary embodiment of the present inventive concept.

Referring to FIG. 7, a memory device 100a according to an exemplary embodiment of the present inventive concept may be different from the memory device 100 described above with reference to FIG. 3, in that the lower electrode layer 141 and the selection device layer 143 are formed as damascene structures. As an example, in the memory device 100a according to an exemplary embodiment of the present inventive concept, the lower electrode layer 141 and the selection device layer 143 may be formed by a damascene process, and the intermediate electrode layer 145, the heating electrode layer 147, the variable resistance layer 149, and the upper electrode layer 148 may be formed by an etching process. Thus, the lower electrode layer 141 and the selection device layer 143 may have a structure, of which a width is reduced along a downward direction. The downward direction may be orthogonal to an upper surface of the substrate 101.

In the memory device 100a according to an exemplary embodiment of the present inventive concept, lower spacers 152 may be formed on side surfaces of the lower electrode layer 141 and the selection device layer 143. In the memory device 100a according to an exemplary embodiment of the present inventive concept, when the lower electrode layer 141 and the selection device layer 143 are formed by the damascene process, the lower spacers 152 may be formed on side surfaces in trenches in advance, and after that, the lower electrode layer 141 and the selection device layer 143 may be formed. Thus, the memory device 100a according to an exemplary embodiment of the present inventive concept may include the lower spacers 152 on the side surfaces of the lower electrode layer 141 and the selection device layer 143. According to an exemplary embodiment of the present inventive concept, the lower spacers 152 may be omitted.

Figure 8:
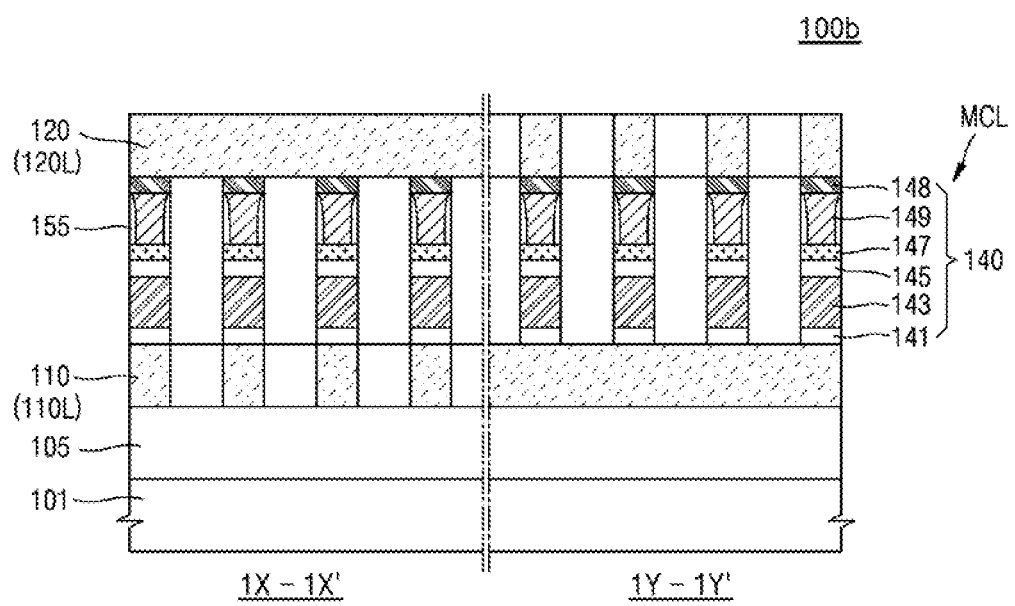

Referring to FIG. 8, a memory device 100b according to an exemplary embodiment of the present inventive concept may be different from the memory device 100 described above with reference to FIG. 3, in that the variable resistance layer 149 may be formed as a damascene structure. As an example, in the memory device 100b according to an exemplary embodiment of the present inventive concept, the lower electrode layer 141, the selection device layer 143, the intermediate electrode layer 145, the heating electrode layer 147, and the upper electrode layer 148 may be formed by an etching method, and the variable resistance layer 149 may be formed by a damascene process. In the memory device 100b according to an exemplary embodiment of the present inventive concept, upper spacers 155 may be formed on side surfaces of the variable resistance layer 149. The upper spacer 155 may be formed in the same manner as that of the lower spacer 152 in the memory device 100a described with reference to FIG. 7. For example, trenches may be formed in an insulating layer, the upper spacers 155 may be formed on side surfaces of the trenches, and a material for the variable resistance layer 149 may fill remaining spaces in the trenches. However, according to an exemplary embodiment of the present inventive concept, the upper spacer 155 may be omitted.

Figure 9:
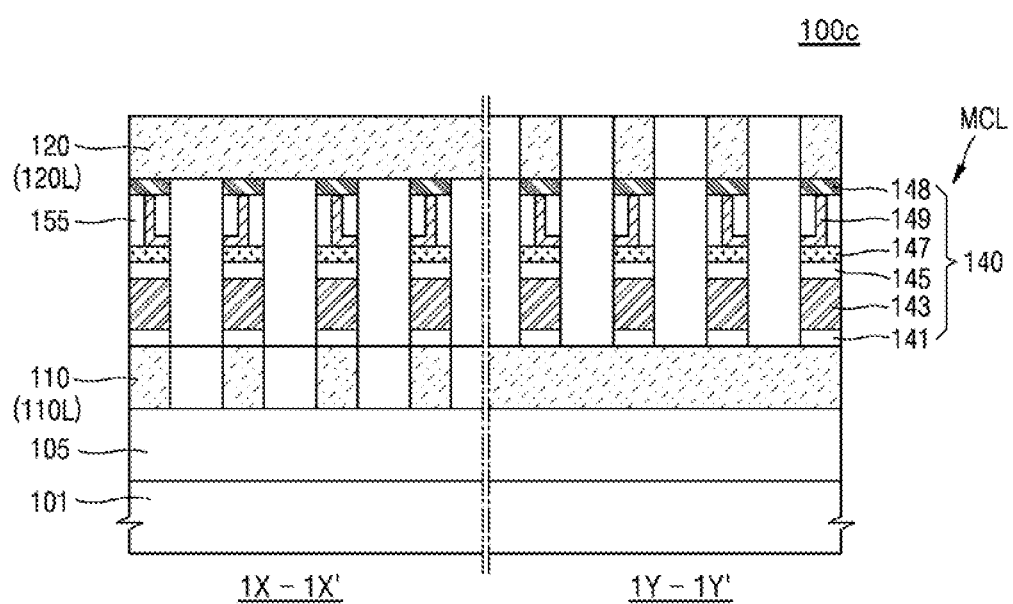

Referring to FIG. 9, a memory device 100c according to an exemplary embodiment of the present inventive concept is different from the memory device 100b described with reference to FIG. 8, in that the variable resistance layer 149 may be formed as a damascene structure to have 'L'-shaped structure. As an example, in the memory device 100c according to an exemplary embodiment of the present inventive concept, the lower electrode layer 141, the selection device layer 143, the intermediate electrode layer 145, the heating electrode layer 147, and the upper electrode layer 148 may be formed by an etching method, and the variable resistance layer 149 may be formed by a damascene process.

In the memory device 100c according to an exemplary embodiment of the present inventive concept, the upper spacers 155 may be formed on the side surfaces of the variable resistance layer 149. However, since the variable resistance layer 149 is formed to have an 'L'-shaped structure, the upper spacers 155 may be formed in an asymmetric structure. The variable resistance layer 149 having the 'L'-shaped structure may be formed by the damascene process. The damascene process will be described in more detail below. An insulating layer for the formation of the upper spacers 155 may be formed on the heating electrode layer 147, and trenches may be formed in the insulating layer. The trenches may be formed wide to overlap adjacent memory cells 140 (e.g., along the direction orthogonal to the upper surface of the substrate 101). Next, a first material layer that will configure the variable resistance layer may be formed conformally in the trenches and on the insulating layer, and after that, a second material layer that will form the upper spacers may be formed on the first material layer. Then, a chemical mechanical polishing (CMP) process may be performed to planarize and expose an upper surface of the insulating layer. After the planarization, a mask pattern aligned with the memory cells 140 may be formed, and the first material layer and the second material layer may be etched by using the mask pattern to form the variable resistance layer 149 of the 'L'-shape and the upper spacers 155.

Figure 10:
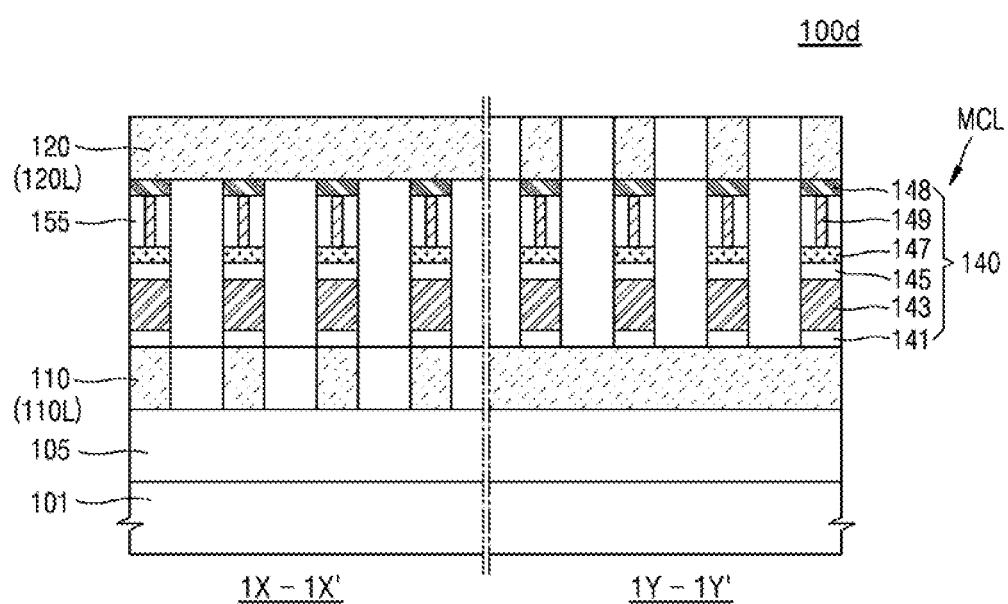

Referring to FIG. 10, a memory device 100d according to an exemplary embodiment of the present inventive concept is different from the memory device 100c described above with reference to FIG. 9 in that the variable resistance layer 149 may be formed as a dash structure. The variable resistance layer 149 of the dash structure may be formed in a similar manner to that forming the variable resistance layer 149 in the 'L'-shaped structure. For example, a first material layer for forming the variable resistance layer 149 may be formed conformally in the trenches and on the insulating layer, and after that, the first material layer may remain only on side walls of the trenches through an anisotropic etching. After that, a second material layer may be formed to cover the first material layer. A planarization may be performed through a CMP process to expose an upper surface of the insulating layer. After the planarization process, a mask pattern aligned with the memory cells 140 may be formed, and the second material layer may be etched by using the mask pattern to form the variable resistance layer 149 of the dash structure and the upper spacers 155.

Figure 11:
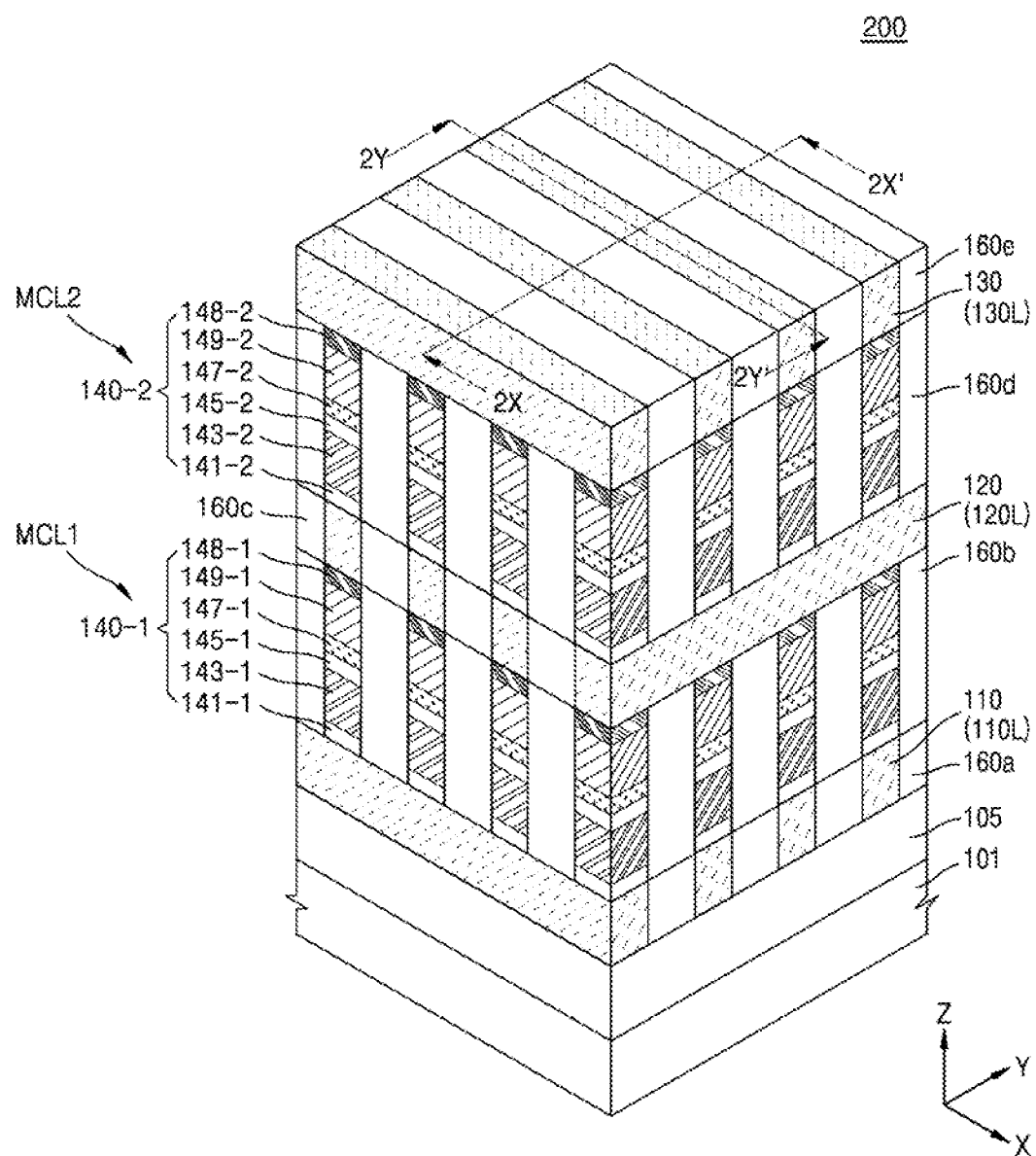
FIG. 11 is a perspective view of a memory device according to an exemplary embodiment of the present inventive concept.
Figure 12:
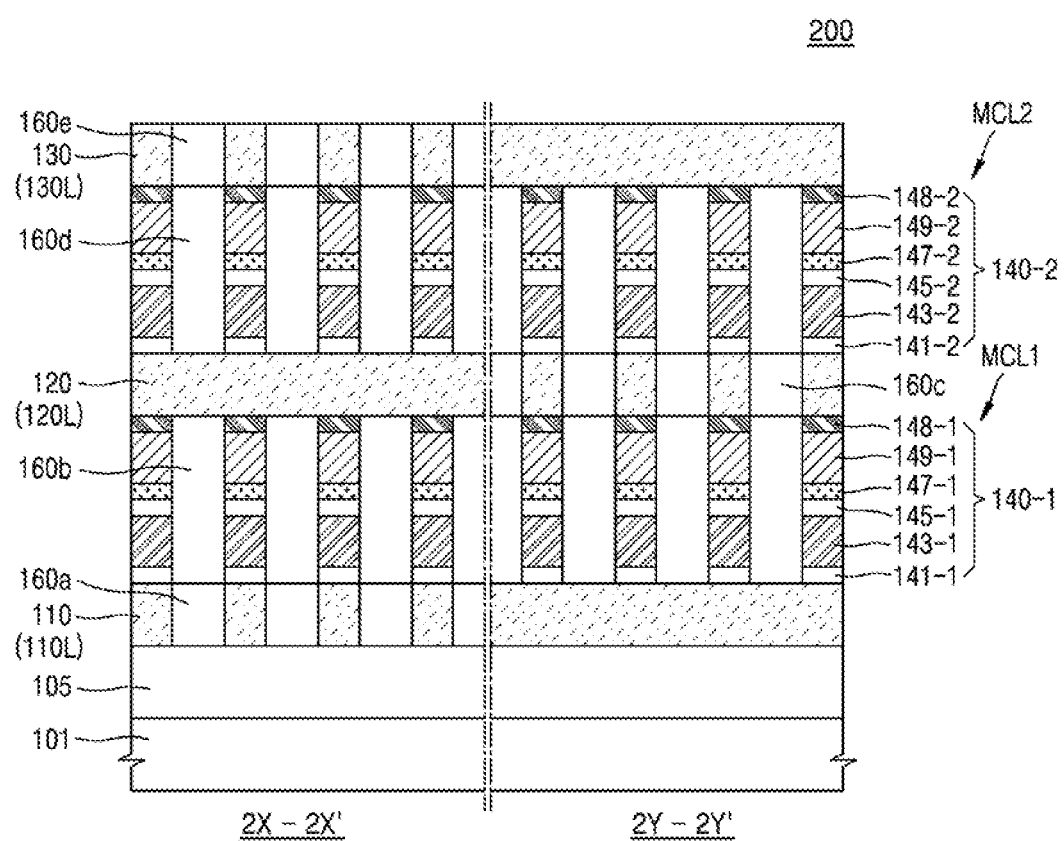
FIG. 12 is a cross-sectional view taken along lines 2X-2X' and 2Y-2Y' of FIG. 11.

FIG. 11 is a perspective view of a memory device according to an exemplary embodiment of the present inventive concept. FIG. 12 is a cross-sectional view taken along lines 2X-2X' and 2Y-2Y' of FIG. 11. Descriptions that are the same as those described above with reference to FIGS. 2 and 3 may be omitted below.

Referring to FIGS. 11 and 12, a memory device 200 may include the first electrode line layer 110L, the second electrode line layer 120L, a third electrode line layer 130L, a first memory cell layer MCL1, and a second memory cell layer MCL2 positioned above the substrate 101.

The insulating interlayer 105 may be disposed on the substrate 101. The first electrode line layer 110L may include a plurality of first electrode lines 110 extending in a first direction (e.g., the X direction) in parallel with one another. The second electrode line layer 120L may include a plurality of second electrode lines 120 extending in a second direction (e.g., the Y direction) that is perpendicular to the first direction in parallel with one another. The third electrode line layer 130L may include a plurality of third electrode lines 130 extending in the first direction (e.g., the X direction) in parallel with one another. The third electrode lines 130 may be identical with the first electrode lines 110 in the extending direction or arrangement structure, except for locations thereof in a third direction (e.g., the Z direction). Thus, the third lines 130 may be referred to as first electrode lines in the third electrode line layer 130L.

In view of driving the memory device 200, the first electrode lines 110 and the third electrode lines 130 may each be in positions corresponding to word lines, and the second electrode lines 120 may each be in positions corresponding to bit lines. Alternatively, the first electrode lines 110 and the third electrode lines 130 may each be in positions corresponding to the bit lines, and the second electrode lines 120 may each be in positions corresponding to the word lines. When the first electrode lines 110 and the third electrode lines 130 are in positions corresponding to the word lines, the first electrode lines 110 may each be in positions corresponding to lower word lines and the third electrode lines 130 may each be in positions corresponding to upper word lines, and the second electrode lines 120 may each be in positions corresponding to common bit lines shared by the lower and upper word lines.

The first electrode lines 110, the second electrode lines 120, and the third electrode lines 130 may each include a metal, a conductive metal nitride, a conductive metal oxide, or a combination thereof. In addition, the first electrode lines 110, the second electrode lines 120, and the third electrode lines 130 may each include a metal layer, and a conductive barrier layer at least partially covering the metal layer.

The first memory cell layer MCL1 may include a plurality of first memory cells 140-1 spaced apart from one another in the first direction and the second direction. The second memory cell layer MCL2 may include a plurality of second memory cells 140-2 spaced apart from one another in the first direction and the second direction. The first electrode lines 110 and the second electrode lines 120 cross each other, and the second electrode lines 120 and the third electrode lines 130 may cross each other. The first memory cells 140-1 may be positioned on portions where the first electrode lines 110 and the second electrode lines 120 cross each other between the first electrode line layer 110L and the second electrode line layer 120L. The second memory cells 140-2 may be positioned on portions where the second electrode lines 120 and the third electrode lines 130 cross each other between the second electrode line layer 120L and the third electrode line layer 130L.

The first memory cells 140-1 may include a lower electrode layer 141-1, a selection device layer 143-1, an intermediate electrode layer 145-1, a heating electrode layer 147-1, a variable resistance layer 149-1, and an upper electrode layer 148-1.

The second memory cells 140-2 may include a lower electrode layer 141-2, a selection device layer 143-2, an intermediate electrode layer 145-2, a heating electrode layer 147-2, a variable resistance layer 149-2, and an upper electrode layer 148-2.

Thus, the first memory cells 140-1 and the second memory cells 140-2 may have substantially the same structures.

The first insulating layer 160a may be positioned between adjacent first electrode lines 110, and the second insulating layer 160b may be positioned between adjacent first memory cells 140-1 of the first memory cells MCL1. The third insulating layer 160c may be positioned between adjacent second electrode lines 120, a fourth insulating layer 160d may be positioned between adjacent second memory cells 140-2 of the second memory cell layer MCL2, and a fifth insulating layer 160e may be positioned between adjacent third electrode lines 130. The first to fifth insulating layers 160a to 160e may include a same material as each other, or at least one of the first to fifth insulating layers 160a to 160e may include a different material from the others of the first to fifth insulating layers 160a to 160e. The first to fifth insulating layers 160a to 160e may include a dielectric material of oxide or nitride, and may electrically isolate devices from one another in each layer. In addition, air gaps may be formed instead of at least one of the second insulating layer 160b and the fourth insulating layer 160d. When the air gaps are formed, an insulating liner having a predetermined thickness may be formed between the air gaps and the first memory cells 140-1, and/or between the air gaps and the second memory cells 140-2.

The memory device 200 according to an exemplary embodiment of the present inventive concept may have a structure, in which the memory device 100 having the structure described with reference to FIGS. 2 and 3 is repeatedly stacked. However, the memory device 200 is not limited thereto. For example, the memory device 200 according to an exemplary embodiment of the present inventive concept may have a structure, in which the memory devices 100a, 100b, 100c and/or 100d of various structures described with reference to FIGS. 7 to 10 are stacked.

Figure 13:
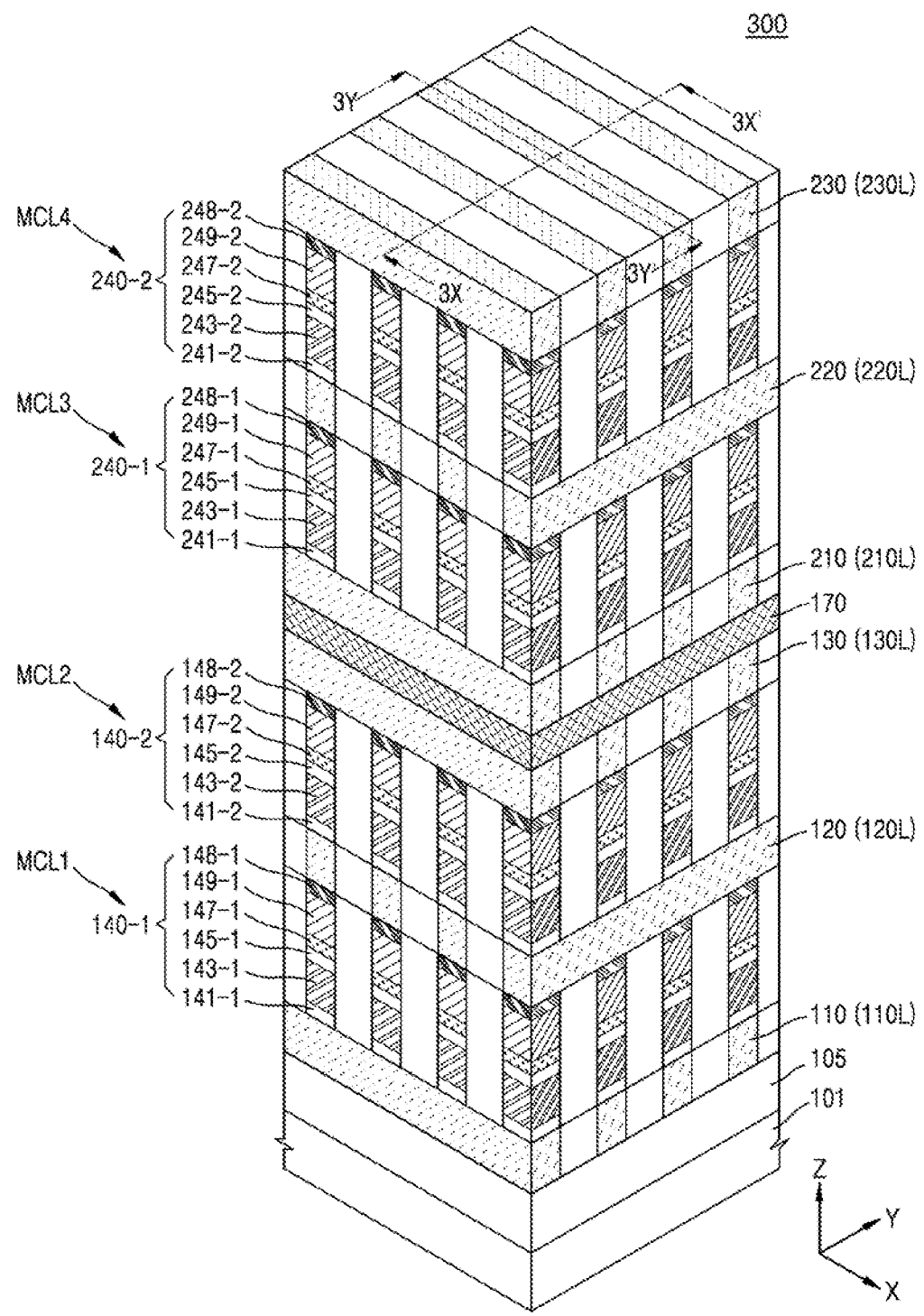
FIG. 13 is a perspective view of a memory device according to an exemplary embodiment of the present inventive concept.
Figure 14:
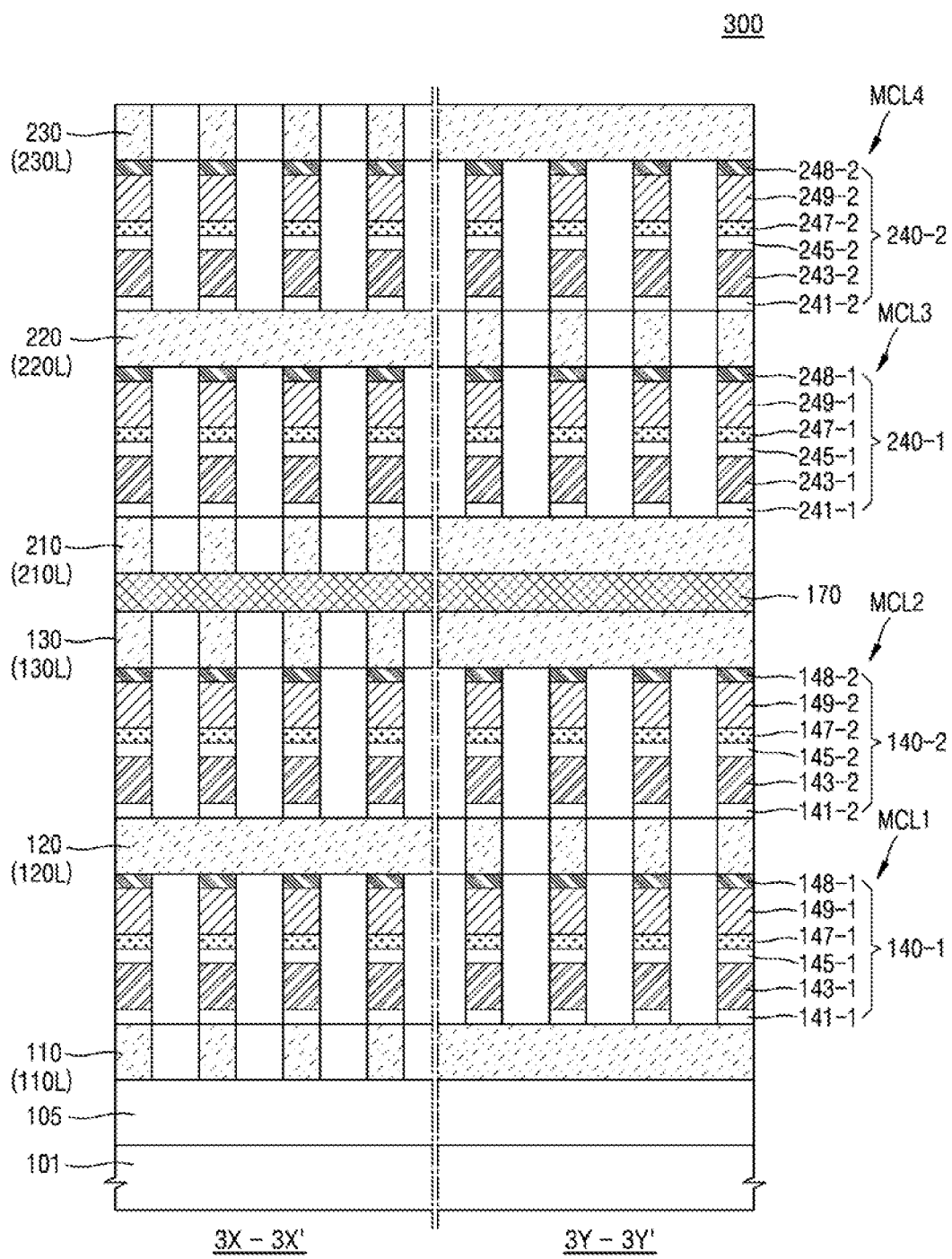
FIG. 14 is a cross-sectional view taken alone lines 3X-3X' and 3Y-3Y' of FIG. 13.

FIG. 13 is a perspective view of a memory device according to an exemplary embodiment of the present inventive concept. FIG. 14 is a cross-sectional view taken alone lines 3X-3X' and 3Y-3Y' of FIG. 13. Descriptions that are the same as those described above with reference to FIGS. 2, 3, 11, and 12 may be omitted below.

Referring to FIGS. 13 and 14, a memory device 300 according to an exemplary embodiment of the present inventive concept may have a four-layered structure including four memory cell layers MCL1, MCL2, MCL3, and MCL4. As an example, the first memory cell layer MCL1 may be positioned between the first electrode line layer 110L and the second electrode line layer 120L, and the second memory cell layer MCL2 may be positioned between the second electrode line layer 120L and the third electrode line layer 130L. A second insulating interlayer 170 may be disposed on the third electrode line layer 130L, and a first upper electrode line layer 210L, a second upper electrode line layer 220L, and a third upper electrode line layer 230L may be positioned above the second insulating interlayer 170. The first upper electrode line layer 210L includes first upper electrode lines 210 having the same structure as that of the first electrode lines 110, the second upper electrode line layer 220L includes second upper electrode lines 220 having the same structure as that of the second electrode lines 120, and the third upper electrode line layer 230L includes third upper electrode lines 230 having the same structure as that of the third electrode lines 130 or the first electrode lines 110. The first upper memory cell layer MCL3 may be positioned between the first upper electrode line layer 210L and the second upper electrode line layer 220L, and the second upper memory cell layer MCL4 may be positioned between the second upper electrode line layer 220L and the third upper electrode line layer 230L.

According to an exemplary embodiment of the present inventive concept, the first upper memory cell layer MCL3 may include a plurality of first upper memory cells 240-1 spaced apart from one another in the first direction and the second direction. The second upper memory cell layer MCL4 may include a plurality of second upper memory cells 240-2 spaced apart from one another in the first direction and the second direction.

The first upper memory cells 240-1 may include a lower electrode layer 241-1, a selection device layer 243-1, an intermediate electrode layer 245-1, a heating electrode layer 247-1, a variable resistance layer 249-1, and an upper electrode layer 248-1.

The second upper memory cells 240-2 may include a lower electrode layer 241-2, a selection device layer 243-2, an intermediate electrode layer 245-2, a heating electrode layer 247-2, a variable resistance layer 249-2, and an upper electrode layer 248-2.

Thus, the first upper memory cells 240-1 and the second upper memory cells 240-2 may have substantially the same structures.

The first to third electrode line layers 110L to 130L and the first and second memory cells MCL1 and MCL2 are substantially the same as those described above with reference to FIGS. 2, 3, 11, and 12. In addition, the first to third upper electrode line layers 210L to 230L, and the first and second upper memory cell layers MCL3 and MCL4 may be substantially the same as the first to third electrode line layers 110L to 130L, and the first and second memory cell layers MCL1 and MCL2, except for being positioned on the second insulating interlayer 170 instead of the first insulating interlayer 105.

The memory device 300 according to an exemplary embodiment of the present inventive concept may have a structure, in which the memory device 100 having the structure described with reference to FIGS. 2 and 3 is repeatedly stacked, but exemplary embodiments of the present inventive concept are not limited thereto. For example, the memory device 300 according to an exemplary embodiment of the present inventive concept may have a structure, in which the memory devices 100a, 100b, 100c and/or 100d having various structures described with reference to FIGS. 7 to 10 are stacked.

Figure 15:
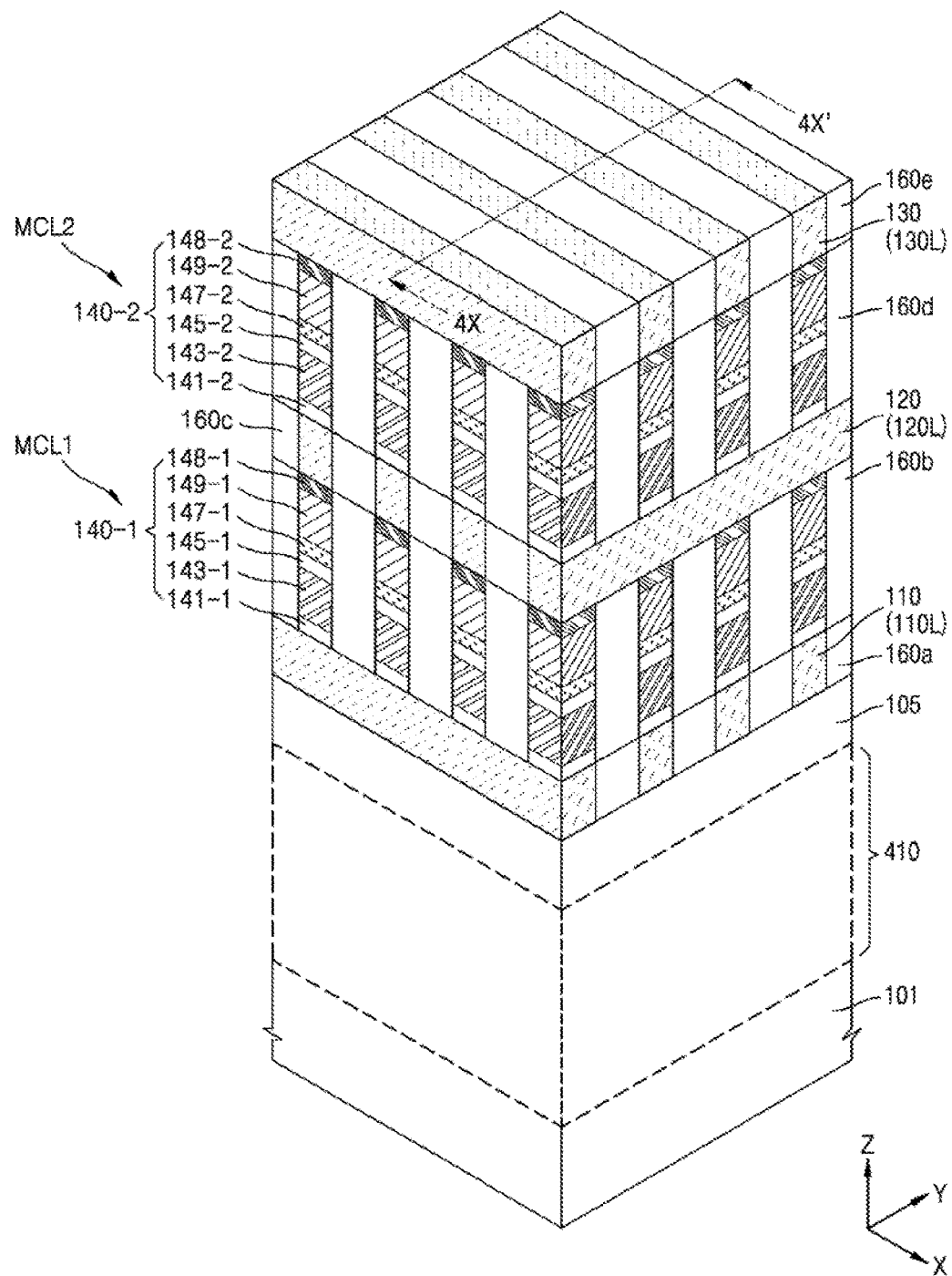
FIG. 15 is a perspective view of a memory device according to an exemplary embodiment of the present inventive concept.
Figure 16:
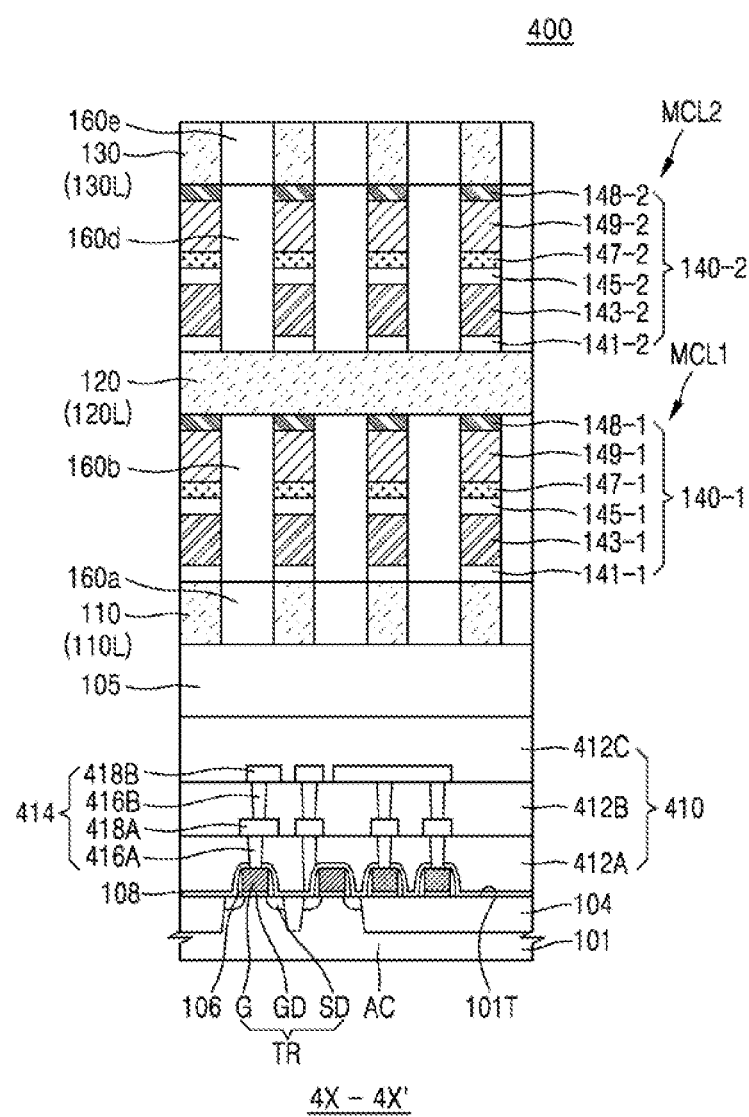
FIG. 16 is a cross-sectional view taken along a line 4X-4X' of FIG. 15.

FIG. 15 is a perspective view of a memory device according to an exemplary embodiment of the present inventive concept. FIG. 16 is a cross-sectional view taken along a line 4X-4X' of FIG. 15. Descriptions that are the same as those described above with reference to FIGS. 2, 3, 11, and 12 may be omitted below.

Referring to FIGS. 15 and 16, a memory device 400 may include a driving circuit region 410 positioned at a first level above the substrate 101 along a direction orthogonal to an upper surface of the substrate 101, and the first memory cell layer MCL1 and the second memory cell layer MCL2 may be positioned at a second level above the substrate 101 along the direction orthogonal to an upper surface of the substrate 101.

Herein, 'level' may refer to a height along the direction orthogonal to an upper surface of the substrate 101 (e.g., the Z direction illustrated in FIGS. 15 and 16). Above the substrate 101, the first level is closer to the substrate 101 than the second level is.

The driving circuit region 410 may be a region where peripheral circuits or driving circuits for driving memory cells in the first memory cell layer MCL1 and the second memory cell layer MCL2 are positioned. For example, the peripheral circuits positioned in the driving circuit region 410 may be circuits capable of processing data input to/output from the first memory cell layer MCL1 and the second memory cell layer MCL2 at a high speed. For example, the peripheral circuits may include a page buffer, a latch circuit, a cache circuit, a column decoder, a sense amplifier, a data in/out circuit, or a row decoder.

An active area AC for driving circuits may be defined on the substrate 101 by an isolation layer 104. A plurality of transistors TR forming the driving circuit region 410 may be positioned in the active area AC of the substrate 101. Each of the plurality of transistors TR may include a gate G, a gate insulating layer GD, and source/drain regions SD. Opposite side walls of the gate G may be covered by insulating spacers 106, and an etch stop layer 108 may be formed on the gate G and the insulating spacers 106. The etch stop layer 108 may be formed on an upper surface 101T of the isolation layer 104. The etch stop layer 108 may be in direct contact with the upper surface 101T of the isolation layer 104 above the substrate 101. The etch stop layer 108 may include an insulating material such as silicon nitride or silicon oxynitride.

A plurality of insulating interlayers 412A, 412B, and 412C may be sequentially stacked on the etch stop layer 108. The plurality of insulating interlayer 412A, 412B, and 412C may each include silicon oxide, silicon nitride, or silicon oxynitride.

The driving circuit region 410 may include multi-layered wiring structures 414 electrically connected to the plurality of transistors TR. The multi-layered wiring structures may be insulated from each other by the plurality of the insulating interlayers 412A, 412B, and 412C.

The multi-layered wiring structures 414 may each include a first contact 416A, a first wiring layer 418A, a second contact 416B, and a second wiring layer 418B that are sequentially stacked on the substrate 101 and are electrically connected to one another. In an exemplary embodiment of the present inventive concept, the first wiring layer 418A and the second wiring layer 418B may include a metal, a conductive metal nitride, a metal silicide, or a combination thereof. For example, the first wiring layer 418A and the second wiring layer 418B may include a conductive material such as tungsten, molybdenum, titanium, cobalt, tantalum, nickel, tungsten silicide, cobalt silicide, tantalum silicide, or nickel silicide.

Referring to FIG. 16, the multi-layered wiring structure 414 may have a double-layered wiring structure including the first wiring layer 418A and the second wiring layer 418B, but exemplary embodiments of the present inventive concept are not limited to the exemplary embodiment of the present inventive concept described with reference to FIG. 16. For example, the multi-layered wiring structure 414 may include three or more wiring layer structures, according to a layout of the driving circuit region 410, and an arrangement of the gate G.

The insulating interlayer 105 may be formed on the plurality of insulating interlayers 412A, 412B, and 412C. The first and second memory cell layers MCL1 and MCL2 may be arranged positioned above the insulating interlayer 105.

A wiring structure connected between the first and second memory cell layers MCL1 and MCL2 and the driving circuit region 410 may penetrate through the insulating interlayer 105.

As an example, in the memory device 400, since the first and second memory cell layers MCL1 and MCL2 are positioned in the driving circuit region 410, integrity of the memory device 400 may be further increased.

Figure 17:
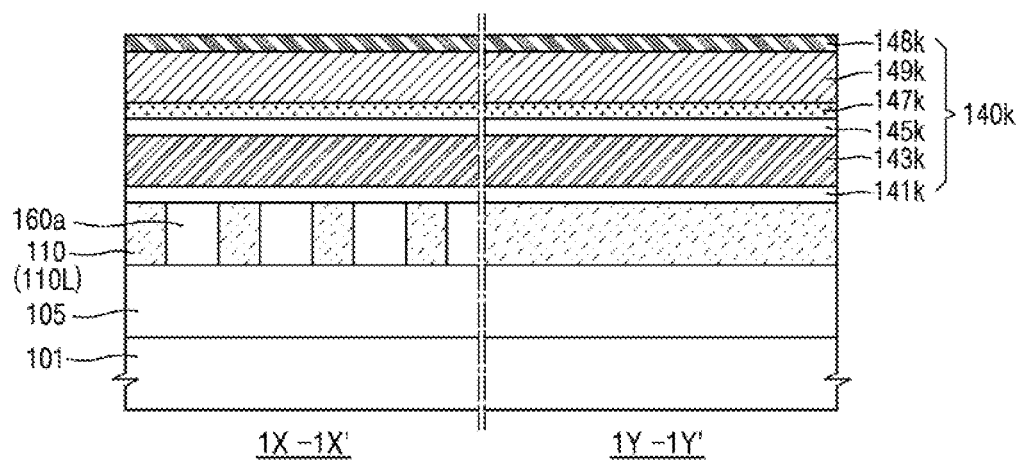
FIGS. 17 to 19 are cross-sectional views illustrating processes of manufacturing the memory device of FIG. 2, according to an exemplary embodiment of the present inventive concept.
Figure 18:
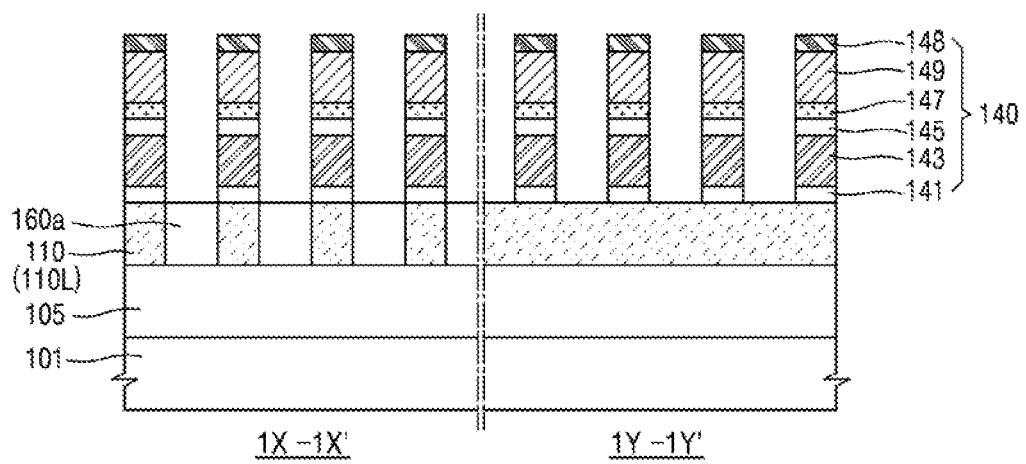
Figure 19:
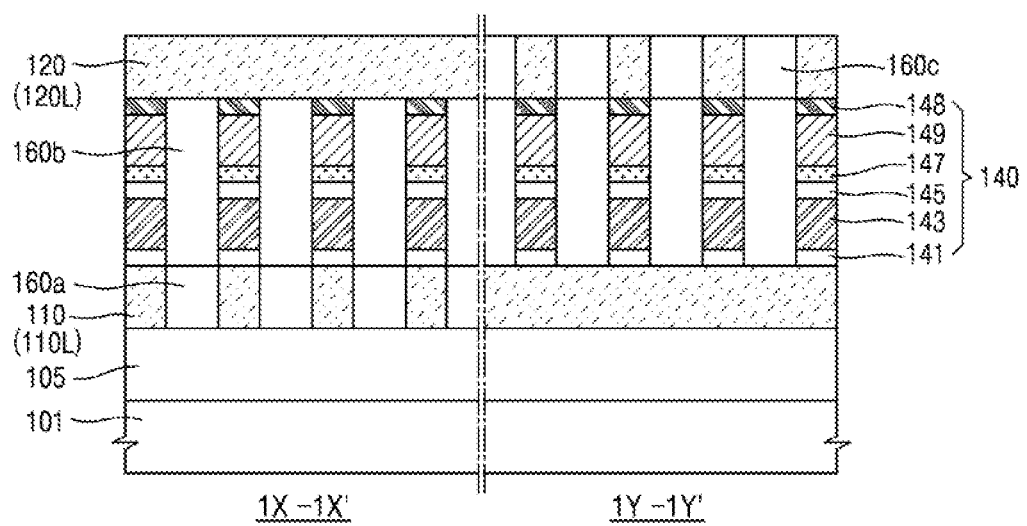

FIGS. 17 to 19 are cross-sectional views illustrating processes of manufacturing the memory device of FIG. 2, according to an exemplary embodiment of the present inventive concept.

Referring to FIG. 17, the insulating interlayer 105 may be disposed on the substrate 101. The insulating interlayer 105 may include, for example, silicon oxide or silicon nitride; however, exemplary embodiments of the present inventive concept are not limited thereto. The first electrode line layer 110L including the plurality of first electrode lines 110 extending in the first direction (e.g., the X direction) and spaced apart from one another may be positioned above the insulating interlayer 105. The first electrode lines 110 may be formed by the etching process or the damascene process described herein. Materials included in the first electrode lines 110 are described above, for example, with reference to FIGS. 2 and 3. The first insulating layer 160a extending in the first direction may be positioned between adjacent first electrode lines 110.

A lower electrode material layer 141k, a selection device material layer 143k, an intermediate electrode material layer 145k, a heating electrode material layer 147k, a variable resistance material layer 149k, and an upper electrode material layer 148k may be sequentially stacked on the first electrode line layer 110L and the first insulating layer 160a to form a stack structure 140k. Materials and functions of the material layers included in the stack structure 140k are already described above, for example, with reference to FIGS. 2 and 3.

The selection device material layer 143k may be formed by a physical vapour deposition (PVD) process by using a target including a chalcogenide switching material (e.g., the chalcogenide switching material according to chemical formula 1, described in more detail above, for example, with reference to FIG. 2) that includes Ge, Se, and Te and selectively includes, as an additive element (X), at least one selected from B, C, N, O, P, or S. Alternatively, the selection device material layer 143k may be formed by a PVD process by using a target including a chalcogenide switching material (e.g., the chalcogenide switching material according to chemical formula 2, described above in more detail, for example, with reference to FIG. 2) that includes Ge, Se, Te, and As and selectively includes, as an additive element (X), at least one selected from B, C, N, O, P, or S. In an exemplary embodiment of the present inventive concept, the selection device material layer 143k may be formed by a chemical vapour deposition (CVD) process or an atomic layer deposition (ALD) process by using a source including a chalcogenide switching material according to chemical formula 1 or chemical formula 2.

The chalcogenide switching material according to chemical formula 1 and chemical formula 2 might not include Si. If the chalcogenide switching material includes Si, silicon particles may agglomerate and be separated in the target during the target formation process or pores may occur in the target, and thus silicon particles may agglomerate and be separated or pores may be formed in the selection device material layer 143k and thus the film quality of the selection device material layer 143k may be relatively low. However, the chalcogenide switching material according to chemical formula 1 or chemical formula 2 does not include Si, and thus the selection device material layer 143k formed by the PVD process may have relatively high film quality.

Referring to FIG. 18, after forming the stack structure 140k (see, e.g., FIG. 17), mask patterns spaced apart from each other in the first direction (e.g., the X direction) and the second direction (e.g., the Y direction) may be formed on the stack structure 140k. After that, the stack structure 140k may be etched by using the mask patterns so that upper surfaces of the first insulating layer 160a and the first electrode lines 110 are partially exposed to form the plurality of memory cells 140.

The memory cells 140 may be spaced apart from each other in the first and second directions according to the shape of the mask patterns, and may be electrically connected to the first electrode lines 110 thereunder. In addition, the memory cells 140 may each include the lower electrode layer 141, the selection device layer 143, the intermediate electrode layer 145, the heating electrode layer 147, the variable resistance layer 149, and the upper electrode layer 148. After forming the memory cells 140, remaining mask patterns may be removed by an ashing process and a strip process.

The memory cells 140 may be formed by the etching process; however, exemplary embodiments of the present inventive concept are not limited thereto. In an exemplary embodiment of the present inventive concept, the memory cells 140 may be formed by the damascene process described herein. For example, when the variable resistance layer 149 in the memory cell 140 is formed by the damascene process, an insulating material layer may be formed first and then may be etched to form trenches exposing the upper surface of the heating electrode layer 147. After that, a phase change material may be filled in the trenches, and then, a planarization may be performed by using the CMP process to form the variable resistance layer 149.

Referring to FIG. 19, the second insulating layer 160b filling between adjacent ones of the memory cells 140 may be formed. The second insulating layer 160b may include the same oxide or nitride material as/or different oxide or nitride material from that of the first insulating layer 160a. An insulating material layer may be formed to have a sufficient thickness enough to completely fill spaces between the memory cells 140, and then, planarized by the CMP process to expose the upper surface of the upper electrode layer 148 and to form the second insulating layer 160b.

A conductive layer for forming the second electrode line layer may be formed and patterned by an etching process to form the second electrode lines 120. The second electrode lines 120 may extend in the second direction (e.g., the Y direction) and may be spaced apart from one another. The third insulating layer 160c extending in the second direction may be positioned between adjacent second electrode lines 120. The second electrode lines 120 may be formed by the etching process; however, exemplary embodiments of the present inventive concept are not limited thereto. For example, the second electrode lines 120 may be formed by the damascene process. When the second electrode lines 120 are formed by the damascene process, an insulating material layer may be formed on the memory cells 140 and the second insulating layer 160b, and the insulating material layer may be etched to form trenches extending in the second direction and exposing the upper surface of the variable resistance layer 149. After that, the trenches may be filled with a conductive material and planarized to form the second electrode lines 120. The insulating material layer filling between adjacent memory cells 140 may be formed to be relatively thick and planarized, and then, trenches may be formed in the insulating material layer to form the second electrode lines 120. Thus, the second insulating layer and the third insulating layer may be formed integrally (e.g., as one-body type) by using a same material.

While the present inventive concept has been particularly shown and described with reference to exemplary embodiments thereof, it will be understood that various changes in form and details may be made therein without departing from the spirit and scope of the present inventive concept.

What is claimed is:

1. A memory device comprising:
   a variable resistance layer; and
   a selection device layer electrically connected to the variable resistance layer, wherein the selection device layer includes a chalcogenide switching material having a composition according to chemical formula 1 below,

   $$[Ge_A Se_B Te_C]_{(1-U)}[X]_U \qquad (1)$$

wherein $0.20 \leq A \leq 0.40$, $0.40 \leq B \leq 0.70$, $0.05 \leq C \leq 0.25$, $A+B+C=1$, $0.0 \leq U \leq 0.20$, and wherein X is at least one selected from boron (B), carbon (C), nitrogen (N), oxygen (O), phosphorus (P), or sulfur (S).

2. The memory device of claim 1, wherein in the chemical formula 1, A ranges from about 0.25 to about 0.35, B ranges from about 0.45 to about 0.65, and C ranges from about 0.10 to about 0.20.

3. The memory device of claim 1, wherein in the chemical formula 1, U ranges from about 0.001 to about 0.20 when X is boron (B), ranges from about 0.001 to about 0.10 when X is carbon (C), ranges from about 0.08 to about 0.20 when X is nitrogen (N), ranges from about 0.001 to about 0.08 when X is phosphorus (P), and ranges from about 0.001 to about 0.08 when X is sulfur (S).

4. The memory device of claim 1, wherein the chalcogenide switching material has a composition according to chemical formula 2 below, wherein Arsenic (As) is farther added to the chemical formula 1,

   $$[Ge_A Se_B Te_C As_D]_{(1-U)}[X]_U \qquad (2)$$

wherein $0.20 \leq A \leq 0.35$, $0.45 \leq B \leq 0.65$, $0.04 \leq C \leq 0.18$, $0.0 \leq D \leq 0.18$, $A+B+C+D=1$, $0.0 \leq U \leq 0.20$, and wherein X is at least one selected from boron (B), carbon (C), nitrogen (N), oxygen (O), phosphorus (P), or sulfur (S).

5. The memory device of claim 4, wherein in the chemical formula 2, A ranges from about 0.20 to about 0.30, B ranges from about 0.45 to about 0.60, C ranges from about 0.04 to about 0.18, and D ranges from about 0.04 to about 0.18.

6. The memory device of claim 1, wherein the chalcogenide switching material does not include silicon (Si).

7. The memory device of claim 1, wherein the chalcogenide switching material does not include antimony (Sb).

8. The memory device of claim 1, wherein the chalcogenide switching material is configured to have Ovonic threshold switching (OTS) characteristics.

9. The memory device of claim 1, wherein the variable resistance layer includes a chalcogenide memory material having a different composition from that of the chalcogenide switching material, and the chalcogenide memory material includes at least two selected from silicon (Si), germanium (Ge), antimony (Sb), tellurium (Te), bismuth (Bi), indium (In), tin (Sn), or selenium (Se).

10. The memory device of claim 9, wherein the chalcogenide memory material further includes at least one selected from boron (B), carbon (C), nitrogen (N), or oxygen (O), and a melting point of the chalcogenide memory material is less than about 800° C.

11. A memory device comprising:
    a plurality first electrode lines positioned above a substrate and extending in a first direction that is in parallel with an upper surface of the substrate;
    a plurality of second electrode lines positioned above the plurality of first electrode lines and extending in a second direction that is in parallel with the upper surface of the substrate and crosses the first direction;
    a plurality of third electrode lines positioned above the plurality of second electrode lines and extending in the first direction; and
    a plurality of memory cells respectively formed at points where the plurality of first electrode lines and the plurality of second electrode lines cross one another between the plurality of first electrode lines and the plurality of second electrode lines and at points where the plurality of second electrode lines and the plurality of third electrode lines cross one another between the plurality of second electrode lines and the plurality of third electrode lines,
    wherein each of the plurality of memory cells includes a selection device layer and a variable resistance layer, wherein the selection device layer includes a chalcogenide switching material having a composition according to chemical formula 1 below,

    $$[Ge_A Se_B Te_C]_{(1-U)}[X]_U \qquad (1)$$

wherein $0.20 \leq A \leq 0.40$, $0.40 \leq B \leq 0.70$, $0.05 \leq C \leq 0.25$, $A+B+C=1$, $0.0 \leq U \leq 0.20$, and wherein X is at least one selected from boron (B), carbon (C), nitrogen (N), oxygen (O), phosphorus (P), or sulfur (S).

12. The memory device of claim 11, wherein in the chemical formula 1, A ranges from about 0.25 to about 0.35, B ranges from about 0.45 to about 0.65, and C ranges from about 0.10 to about 0.20.

13. The memory device of claim 11, wherein in the chemical formula 1, U ranges from about 0.001 to about 0.20 when X is boron (B), ranges from about 0.001 to about 0.10 when X is carbon (C), ranges from about 0.08 to about 0.20 when X is nitrogen (N), ranges from about 0.001 to about 0.08 when X is phosphorus (P), and ranges from about 0.001 to about 0.08 when X is sulfur (S).

14. The memory device of claim 11, wherein the chalcogenide switching material has a composition according to chemical formula 2 below, wherein Arsenic (As) is further added to the chemical formula 1,

    $$[Ge_A Se_B Te_C As_D]_{(1-U)}[X]_U \qquad (2)$$

wherein $0.20 \leq A \leq 0.35$, $0.45 \leq B \leq 0.65$, $0.04 \leq C \leq 0.18$, $0.0 \leq D \leq 0.18$, $A+B+C+D=1$, $0.0 \leq U \leq 0.20$, and wherein X is at least one selected from boron (B), carbon (C), nitrogen (N), oxygen (O), phosphorus (P), or sulfur (S).

15. The memory device of claim 14, wherein in the chemical formula 2, A ranges from about 0.20 to about 0.30, B ranges from about 0.45 to about 0.60, C ranges from about 0.04 to about 0.18, and D ranges from about 0.04 to about 0.18.

16. A memory device comprising:
a plurality of first electrode lines positioned above a substrate and extending in a first direction that is in parallel with an upper surface of the substrate;
a plurality of second electrode lines positioned above the plurality of first electrode lines and extending in a second direction that is in parallel with the upper surface of the substrate, wherein the second direction is perpendicular to the first direction;
a plurality of memory cells respectively formed at points where the plurality of first electrode lines and the plurality of second electrode lines cross one another between the plurality of first electrode lines and the plurality of second electrode lines,
wherein each of the plurality of memory cells includes a selection device layer and a variable resistance layer, wherein the selection device layer includes a chalcogenide switching material having a composition according to chemical formula 1 below, $$[Ge_A Se_B Te_C]_{(1-U)}[X]_U \qquad (1)$$

wherein 0.20≤A≤0.40, 0.40≤B≤0.70, 0.05≤C≤0.25, A+B+C=1, 0.0≤U≤0.20, and wherein X is at least one selected from boron (B), carbon (C), nitrogen (N), oxygen (O), phosphorus (P), or sulfur (S).

17. The memory device of claim 16, wherein in the chemical formula 1, A ranges from about 0.25 to about 0.35, B ranges from about 0.45 to about 0.65, and C ranges from about 0.10 to about 0.20.

18. The memory device of claim 16, wherein in the chemical formula 1, U ranges from about 0.001 to about 0.20 when X is boron (B), ranges from about 0.001 to about 0.10 when X is carbon (C), ranges from about 0.08 to about 0.20 when X is nitrogen (N), ranges from about 0.001 to about 0.08 when X is phosphorus (P), and ranges from about 0.001 to about 0.08 when X is sulfur (S).

19. The memory device of claim 16, wherein the chalcogenide switching material has a composition according to chemical formula 2 below, wherein Arsenic (As) is further added to the chemical formula 1, $$[Ge_A Se_B Te_C As_D]_{(1-U)}[X]_U \qquad (2)$$

wherein 0.20≤A≤0.35, 0.45≤B≤0.65, 0.04≤C≤0.18, 0.0≤D≤0.18, A+B+C+D=1, 0.0≤U≤0.20, and wherein X is at least one selected from boron (B), carbon (C), nitrogen (N), oxygen (O), phosphorus (P), or sulfur (S).

20. The memory device of claim 19, wherein in the chemical formula 2, A ranges from about 0.20 to about 0.30, B ranges from about 0.45 to about 0.60, C ranges from about 0.04 to about 0.18, and D ranges from about 0.04 to about 0.18.

* * * * *